(12) United States Patent
Sasaki et al.

(10) Patent No.: US 10,543,486 B2
(45) Date of Patent: Jan. 28, 2020

(54) MICROPERTURBATION ASSEMBLY SYSTEM AND METHOD

(71) Applicant: eLux Inc., Camas, WA (US)

(72) Inventors: Kenji Sasaki, West Lynn, OR (US); Shu-han Yu, Hsinchu (TW); Paul J. Schuele, Washougal, WA (US)

(73) Assignee: eLux Inc., Vancouver, WA (US)

( * ) Notice: Subject to any disclaimer, the term of this patent is extended or adjusted under 35 U.S.C. 154(b) by 241 days.

(21) Appl. No.: 15/722,037

(22) Filed: Oct. 2, 2017

(65) Prior Publication Data
US 2018/0029038 A1     Feb. 1, 2018

Related U.S. Application Data

(63) Continuation-in-part of application No. 15/691,976, filed on Aug. 31, 2017, which is a (Continued)

(51) Int. Cl.
*B01L 3/00*     (2006.01)
*H01L 27/32*     (2006.01)
(Continued)

(52) U.S. Cl.
CPC ....... *B01L 3/502784* (2013.01); *B01L 3/5027* (2013.01); *B01L 3/50273* (2013.01); *B01L 3/502715* (2013.01); *G09G 3/006* (2013.01); *H01L 24/00* (2013.01); *H01L 24/29* (2013.01); *H01L 24/95* (2013.01); *H01L 25/0753* (2013.01); *H01L 27/3244* (2013.01);
(Continued)

(58) Field of Classification Search
CPC ................................................ B01L 3/502784
See application file for complete search history.

(56) References Cited

U.S. PATENT DOCUMENTS 5,249,733 A    10/1993   Brady et al.
5,545,291 A    8/1996   Smith et al.
(Continued)

OTHER PUBLICATIONS

Zheng, "Fluidic Heterogeneous Microsystems Assembly and Packaging", 2006, Journal of Microelectromechanical Systems, vol. 15, No. 4, pp. 864-870. (Year: 2006).*
(Continued)

*Primary Examiner* — Robert A Vetere
(74) *Attorney, Agent, or Firm* — Law Office of Gerald Maliszewski; Gerald Maliszewski

(57) ABSTRACT

Microperturbation fluidic assembly systems and methods are provided for the fabrication of emissive panels. The method provides an emissive substrate with a top surface patterned to form an array of wells. A liquid suspension is formed over the emissive substrate top surface, comprising a first liquid and emissive elements. Using an array of micropores, a perturbation medium, which optionally includes emissive elements, is injected into the liquid suspension. The perturbation medium may be the first liquid, a second liquid, or a gas. A laminar flow is created in the liquid suspension along the top surface of the emissive substrate in response to the perturbation medium, and emissive elements are captured in the wells. The ejection of the perturbation medium can also be used to control the thickness of the liquid suspension overlying the top surface of the emissive substrate.

35 Claims, 10 Drawing Sheets

Related U.S. Application Data continuation-in-part of application No. 15/440,735, filed on Feb. 23, 2017, now Pat. No. 10,381,335, which is a continuation-in-part of application No. 15/416,882, filed on Jan. 26, 2017, which is a continuation-in-part of application No. 15/413,053, filed on Jan. 23, 2017, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(51) Int. Cl.
  *H01L 23/00* (2006.01)
  *H01L 33/00* (2010.01)
  *H01L 25/075* (2006.01)
  *G09G 3/00* (2006.01)
  *H01L 25/00* (2006.01)

(52) U.S. Cl.
  CPC ............ *H01L 33/005* (2013.01); *H01L 25/50* (2013.01); *H01L 33/0095* (2013.01); *H01L 2224/04105* (2013.01); *H01L 2224/73267* (2013.01); *H01L 2224/95085* (2013.01); *H01L 2224/95101* (2013.01); *H01L 2924/15153* (2013.01); *H01L 2933/0033* (2013.01)

(56) References Cited

U.S. PATENT DOCUMENTS

| | | |
|---|---|---|
| 5,594,463 A | 1/1997 | Sakamoto |
| 5,824,186 A | 10/1998 | Smith et al. |
| 5,904,545 A | 5/1999 | Smith et al. |
| 6,274,508 B1 | 8/2001 | Jacobsen et al. |
| 6,281,038 B1 | 8/2001 | Jacobsen et al. |
| 6,316,278 B1 | 11/2001 | Jacobsen et al. |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,507,989 B1 | 1/2003 | Bowden et al. |
| 6,527,964 B1 | 3/2003 | Sakariya et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,247 B2 | 8/2003 | Credelle et al. |
| 6,613,610 B2 | 9/2003 | Iwafuchi et al. |
| 6,618,030 B2 | 9/2003 | Kane et al. |
| 6,623,579 B1 | 9/2003 | Smith et al. |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,687,987 B2 | 2/2004 | Mayer et al. |
| 6,723,576 B2 | 4/2004 | Nozawa et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,825,499 B2 | 11/2004 | Nakajima et al. |
| 6,850,312 B2 | 2/2005 | Jacobsen et al. |
| 6,863,219 B1 | 3/2005 | Jacobsen et al. |
| 6,870,190 B2 | 3/2005 | Okuyama et al. |
| 6,919,225 B2 | 7/2005 | Craig et al. |
| 6,927,085 B2 | 8/2005 | Hadley et al. |
| 6,980,184 B1 | 12/2005 | Stewart et al. |
| 6,984,927 B2 | 1/2006 | Tomoda et al. |
| 6,985,361 B2 | 1/2006 | Credelle et al. |
| 7,046,328 B2 | 5/2006 | Jacobsen et al. |
| 7,049,207 B2 | 5/2006 | Tomoda |
| 7,049,227 B2 | 5/2006 | Tomoda et al. |
| 7,060,542 B2 | 6/2006 | Nakajima et al. |
| 7,070,851 B2 | 7/2006 | Jacobsen et al. |
| 7,080,444 B1 | 7/2006 | Craig et al. |
| 7,087,934 B2 | 8/2006 | Oohata et al. |
| 7,101,502 B2 | 9/2006 | Smith et al. |
| 7,113,250 B2 | 9/2006 | Jacobsen et al. |
| 7,122,826 B2 | 10/2006 | Okuyama et al. |
| 7,129,514 B2 | 10/2006 | Okuyama et al. |
| 7,141,176 B1 | 11/2006 | Smith et al. |
| 7,172,789 B2 | 2/2007 | Smith et al. |
| 7,179,210 B2 | 2/2007 | Soukeras |
| 7,199,527 B2 | 4/2007 | Holman |
| 7,244,326 B2 | 7/2007 | Craig et al. |
| 7,250,314 B2 | 7/2007 | Nakajima et al. |
| 7,250,320 B2 | 7/2007 | Okuyama et al. |
| 7,260,882 B2 | 8/2007 | Credelle et al. |
| 7,288,432 B2 | 10/2007 | Jacobsen et al. |
| 7,317,211 B2 | 1/2008 | Watanabe et al. |
| 7,317,435 B2 | 1/2008 | Hsueh |
| 7,321,159 B2 | 1/2008 | Schatz |
| 7,353,598 B2 | 4/2008 | Craig et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,500,610 B1 | 3/2009 | Hadley et al. |
| 7,531,218 B2 | 5/2009 | Smith et al. |
| 7,542,301 B1 | 6/2009 | Liong et al. |
| 7,561,221 B2 | 7/2009 | Jacobsen et al. |
| 7,564,064 B2 | 7/2009 | Oohata et al. |
| 7,572,649 B2 | 8/2009 | Kanemitsu et al. |
| 7,573,194 B2 | 8/2009 | Doi et al. |
| 7,576,656 B2 | 8/2009 | Craig et al. |
| 7,589,355 B2 | 9/2009 | Tomoda et al. |
| 7,615,479 B1 | 11/2009 | Craig et al. |
| 7,619,598 B2 | 11/2009 | Pulvirenti et al. |
| 7,662,008 B2 | 2/2010 | Hillis et al. |
| 7,723,764 B2 | 5/2010 | Oohata et al. |
| 7,763,901 B2 | 7/2010 | Tomoda |
| 7,774,929 B2 | 8/2010 | Jacobs |
| 7,795,049 B2 | 9/2010 | Watanabe et al. |
| 7,795,629 B2 | 9/2010 | Watanabe et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,927,976 B2 | 4/2011 | Menard |
| 7,931,063 B2 | 4/2011 | Craig et al. |
| 7,968,474 B2 | 6/2011 | Martin et al. |
| 7,977,130 B2 | 7/2011 | Hillis et al. |
| 8,068,661 B2 | 11/2011 | Onushkin et al. |
| 8,101,457 B2 | 1/2012 | Tomoda et al. |
| 8,222,659 B2 | 7/2012 | Tomoda |
| 8,232,640 B2 | 7/2012 | Tomoda et al. |
| 8,252,164 B2 | 8/2012 | Martin et al. |
| 8,257,538 B2 | 9/2012 | Doi et al. |
| 8,284,120 B2 | 10/2012 | Hillis et al. |
| 8,300,007 B2 | 10/2012 | Hillis et al. |
| 8,312,619 B2 | 11/2012 | Chow et al. |
| 8,333,860 B1 | 12/2012 | Bibl et al. |
| 8,349,116 B1 | 1/2013 | Bibl et al. |

(56) References Cited

U.S. PATENT DOCUMENTS

| | | |
|---|---|---|
| 8,361,268 B2 | 1/2013 | Mizuno et al. |
| 8,361,297 B2 | 1/2013 | Mayer et al. |
| 8,379,003 B2 | 2/2013 | Kawaguchi et al. |
| 8,382,544 B2 | 2/2013 | Hillis et al. |
| 8,383,506 B1 | 2/2013 | Golda et al. |
| 8,384,116 B2 | 2/2013 | Ohtorii et al. |
| 8,390,537 B2 | 3/2013 | Hillis et al. |
| 8,409,886 B2 | 4/2013 | Iwafuchi et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,415,879 B2 | 4/2013 | Lowenthal et al. |
| 8,426,227 B1 | 4/2013 | Bibl et al. |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,683,416 B1 | 3/2014 | Trivedi et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,240,397 B2 | 1/2016 | Bibl et al. |
| 9,252,375 B2 | 2/2016 | Bibl et al. |
| 9,269,322 B2 | 2/2016 | Nathan et al. |
| 9,293,476 B2 | 3/2016 | Bedell et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 2002/0153606 A1 | 10/2002 | Gengel |
| 2005/0206585 A1 | 9/2005 | Stewart et al. |
| 2005/0233504 A1 | 10/2005 | Doi et al. |
| 2006/0220989 A1* | 10/2006 | Hillis ............... G09G 3/001 345/30 |
| 2009/0023243 A1* | 1/2009 | Koyanagi ............ H01L 21/568 438/107 |
| 2010/0186883 A1 | 7/2010 | Tomoda |
| 2010/0233794 A1* | 9/2010 | Iwamura ............... B01L 3/021 435/287.3 |
| 2011/0266039 A1 | 11/2011 | Tomoda |
| 2011/0273410 A1 | 11/2011 | Park et al. |
| 2012/0169786 A1 | 7/2012 | Okuyama et al. |
| 2012/0218318 A1 | 8/2012 | Hirao et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2014/0277680 A1 | 9/2014 | Youngquist |
| 2015/0155445 A1 | 6/2015 | Zhan et al. |
| 2015/0179877 A1 | 6/2015 | Hu et al. |
| 2015/0214430 A1 | 7/2015 | Zhan et al. |
| 2015/0263066 A1 | 9/2015 | Hu et al. |
| 2016/0086534 A1 | 3/2016 | Seo et al. |

OTHER PUBLICATIONS

U.S. Appl. No. 14/749,569, Sasaki et al.
U.S. Appl. No. 15/221,571, Crowder et al.
U.S. Appl. No. 15/190,813, Schuele et al.
U.S. Appl. No. 15/158,556, Zhan et al.
U.S. Appl. No. 15/266,796, Heine et al.
US 8,093,720, 1/2012, Sony (withdrawn)
U.S. Appl. No. 14/305,295, pending, LED Display Driving Circuits.
Knuesel et al., "Self-assemby of microopic chiplets at a liquid-liquid-solid interface...", PNAS, Jan. 19, 2010, vol. 107, No. 3, 993-998.
Park et al., "A First Implementation of an Automated Reel-to-Reel Fluidic Self-Assembly Machine", Adv. Mater, 2015, 26, 5942-5949.
Mastrangeli et al., "Self-assemby from milli- to nanoscales: methods and applications", J Micromech Microeng, Jul. 8, 2009; 19(8): 083001.
Bui, Thanh Son, et al. "High optical density and low dielectric constant black matrix containing graphene oxide and carbon black . . . " Displays 34.3 (2013): 192-199.
Den Boer, Willem. Active matrix liquid crystal displays: fundamentals and applications. Elsevier, 2011.

* cited by examiner

MICROPERTURBATION ASSEMBLY SYSTEM AND METHOD

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to fluidic assembly systems and methods for the fabrication of emissive panels using local microperturbation features.

2. Description of the Related Art

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size light emitting diode (LED) micro structures, such as rods, fins, or disks, can be first fabricated on small size wafers and then be transferred to large panel substrate to make a direct emitting display. One conventional means of transferring these LED microstructures is through a pick-and-place process. However, with a display comprising millions of elements, such a process may take several hours to complete and is therefore inefficient.

The fluidic self-assembly of electronic devices, such as LEDs and photovoltaics, is often performed by surface energy minimization at molten solder capillary interfaces so that both mechanical and electrical connections can be made to an electrode during assembly, as demonstrated in U.S. Pat. No. 7,774,929. In one aspect, electronic devices are captured in shape-matched well structures, followed by electrical integration processes, as demonstrated in U.S. Pat. No. 6,316,278.

Some problems yet to be addressed with conventional fluidic assembly processes are related to the distribution method over large scales, the integration of microcomponents to drive circuitry over large areas, and the potential mechanisms for the repair of defective microcomponents. Over large scales, conventional fluidic assembly into wells is challenged by the dual requirements of maximum velocities for microcomponent capture and lesser distribution velocities to minimize the detrapment of microcomponents once they are captured. Similarly, achieving the microcomponent dispensing scheme and flow velocity uniformity necessary for a high yield over the whole assembly substrate becomes very challenging over greater-than-centimeter scales. The prevailing approach in the field of rapid, parallel microcomponent self-assembly is strong capillary trapping forces coupled with relatively high microcomponent velocities, as described in "Self-assembly from milli- to nanoscales: methods and applications", Mastrangeli et al. The motivation for assembly by capillary force is based upon how forces scale as assembled components shrink in size, and capillary force dominates at the microscale. The assembly yield is eventually dictated by the competition between the trapping rate and detrapping rates. Using very strong trapping forces in the form of surface-energy reduction in capillary trapping schemes, such as in hydrophobic/hydrophilic systems or molten solder systems, enables high component velocities, as described in U.S. Pat. No. 6,507,989. Scaling this approach to large areas, however, is sufficiently difficult as to motivate alternate trapping approaches. Approaches with low trapping force, such as dielectrophoresis, are generally limited to low microcomponent velocities so that the microcomponent inertia may be arrested, and the microcomponents trapped. It appears that nearly all investigators in the field maximize assembly speed by maximizing microcomponent velocity within the threshold of capture by the trapping mechanism.

Closed channel assembly, as described by Mastrangeli, is also a standard approach for microfluidic assembly, using a top plate and a fluid thickness generally less than 1 millimeter (mm). It allows a great deal of control, but isn't very practical for manufacturing because the top plates must be sealed and reused.

FIGS. 1A and 1B depict the relationship between the pulsed momentum of microcomponents and trapping (co-pending art). Above a threshold momentum (B), microcomponents 100 in a fluid medium 106 pass over the trapping recess 102 without capture. The primary weakness of the approach is related to the distance-from-impulse, in which impelled microcomponents 100 have too much momentum (A) to be captured in the wells 102. For practical assemblies, this makes efficiently achieving a high fill near substrate edges more difficult. Secondary weaknesses are that high forcing may damage fragile unpackaged microcomponents, and a risk of contamination exists to and from the driver—in the above example, a brush 104.

Additionally, the detrapment rate relies heavily on the fluidic force field near the assembled microcomponents. At scales of a ~40 micron diameter and 5 micron thickness, the gravitational self-pressure of a gallium nitride (GaN) microcomponent LED is less than 0.3 Pascal (Pa), and even a small turbulence at the microcomponent surface can pull the microcomponent out of a recess.

It would be advantageous if there existed a fluidic assembly method for more effectively trapping microcomponents into recesses on a substrate top surface, where the vertical holding force is relatively low.

SUMMARY OF THE INVENTION

Disclosed herein is a fluidic assembly scheme that relies on transverse forcing while limiting turbulence that may induce detrapment of assembled components. This assembly method may use two regimes: 1) a low-force, high-stochasticity assembly by microperturbation, and 2) a higher-force, non-turbulent directed forcing. The low-forcing microperturbation capture method may use pulsed forcing of microcomponents over a substrate possessing recesses in its top surface that accommodate the microcomponents. Once in the recess, the microcomponent may sustain significant lateral force without removal, so that the method is cost-effectively scalable to large areas, and designed to maximize assembly yield and speed through manipulation of relative forces at the microscale. This approach enables high-speed and high-yield assembly using a relatively simple and low-cost infrastructure. Additionally, the fundamental force manipulation includes options for increasing trap rate by providing transverse and downward forces without enabling upwards forces that can remove assembled microcomponents, and extends to limiting the detrapment rate during the removal of residual (unassembled) microcomponents, particles, and assembly fluid on the substrate surface.

Accordingly, a microperturbation fluidic assembly method is provided for the fabrication of emissive panels. The method provides an emissive substrate with a top surface patterned to form an array of wells. A liquid suspension is formed over the emissive substrate top surface, comprising a first liquid and emissive elements. A perturbation medium, which optionally includes emissive elements, is injected into the liquid suspension using an array of micropores. The perturbation medium may be the first liquid, a second liquid, or a gas. In one aspect, the perturbation medium is periodically ejected, creating a pulsed ejection having a frequency in the range of 0.5 to 100 Hertz. The ejection force may originate from either gravity or a positive pressure. In one aspect, the array of micropores is moved in a predetermined pattern with respect to the emissive substrate top surface synchronously with the ejection of the perturbation medium.

In another aspect the perturbation medium is ejected into the liquid suspension in stages. Initially, the perturbation medium is ejected at a first pressure to distribute the emissive elements across the top surface of the emissive substrate, and subsequently ejected at a second pressure, less than the first pressure to create a laminar flow. If emissive elements are equipped with orientation features (e.g., posts), the initial ejecting of the perturbation medium at the first pressure may act to orient the emissive elements in a post-up orientation and remove misaligned emissive elements from the wells. In another variation, the array of micropores is an interleaved array submerged in the liquid suspension, made up of a first group of micropores ejecting perturbation medium and a second group of micropores aspirating liquid suspension.

A laminar flow is created in the liquid suspension along the top surface of the emissive substrate in response to the perturbation medium. In response to the laminar flow, emissive elements are captured in the wells. Simultaneously with the creation of the laminar flow in the liquid suspension, the ejection of the perturbation medium can be used to control the thickness of the liquid suspension overlying the top surface of the emissive substrate.

The array of micropores may be located a predetermined distance above a top surface of the liquid suspension, or submerged in the liquid suspension. In the case of a submerged array of micropores, the method may alternate the application of a positive pressure with a negative pressure into the liquid suspension, creating a periodic cycle of perturbation medium ejection followed by liquid suspension intake, which in turn creates an oscillating laminar flow in the liquid suspension.

Subsequent to capturing the emissive elements in the wells, the liquid suspension may be removed from the emissive substrate by applying heat to the emissive substrate, and/or using the array of micropores and a gaseous perturbation medium to reduce the thickness of the liquid suspension overlying emissive substrate. In another aspect, subsequent to capturing the emissive elements in the well, a detrapping nozzle may be oriented over the emissive substrate to dislodge misaligned and damaged emissive elements from the wells.

Additional details of the above-described method and a microperturbation fluidic system for the assembly of emissive panels are provided below.

DETAILED DESCRIPTION

Figure 2A:
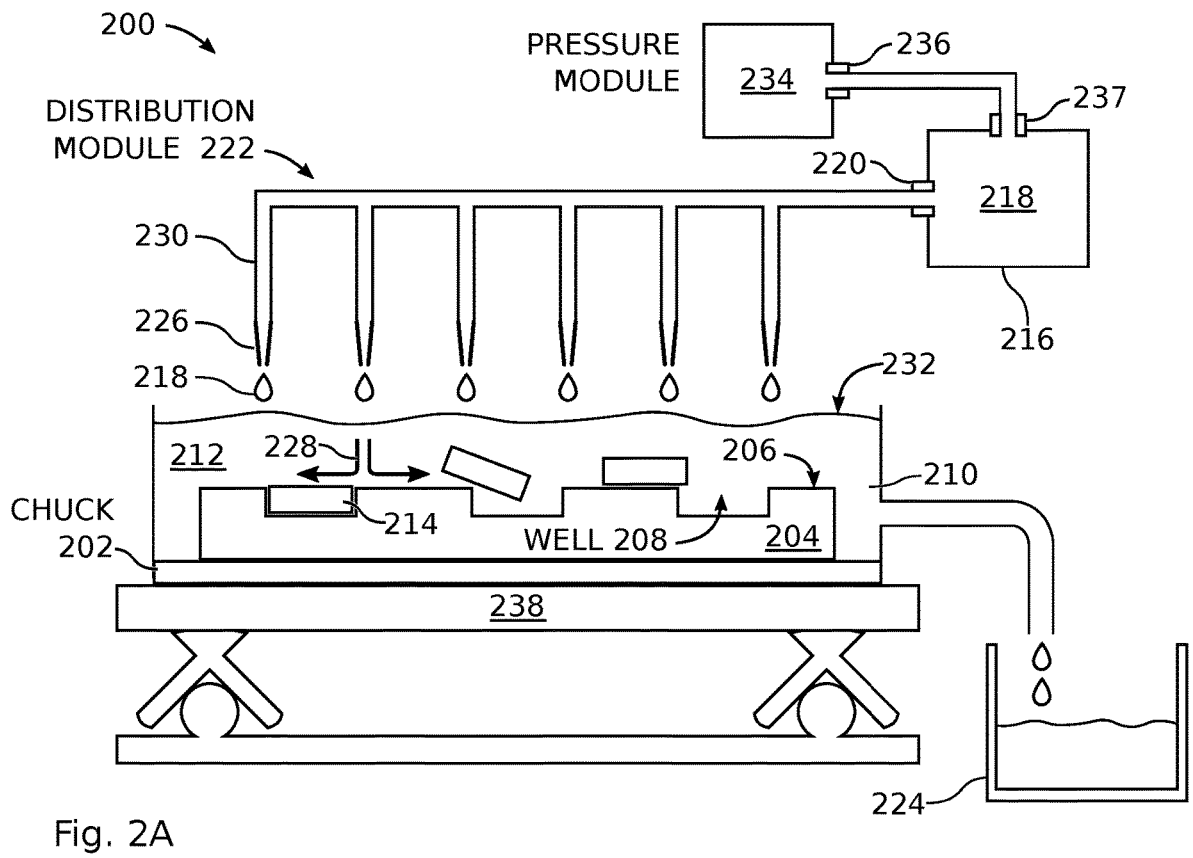
FIGS. 2A and 2B are partial cross-sectional views of an emissive substrate microperturbation fluidic assembly system.
Figure 2B:
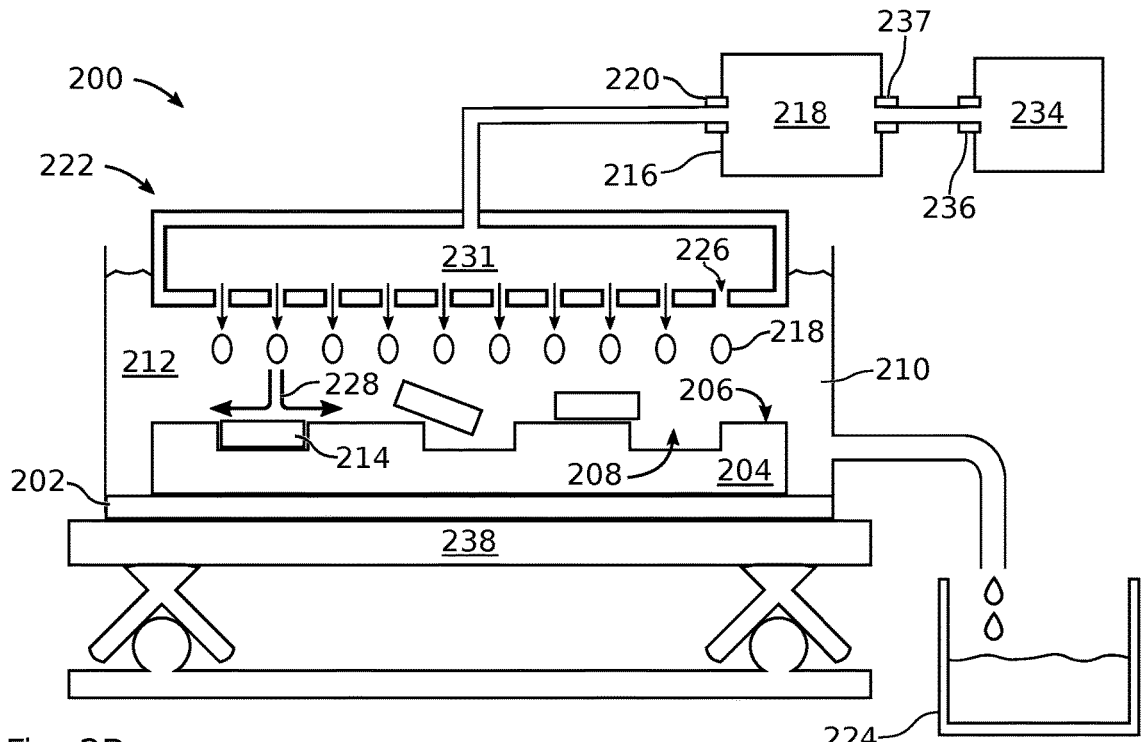

FIGS. 2A and 2B are partial cross-sectional views of an emissive substrate microperturbation fluidic assembly system. The system 200 comprises a substrate chuck 202 for engaging an emissive substrate 204. The emissive substrate 204 has a top surface 206 patterned to form an array of wells 208. A liquid suspension 210 overlies the emissive substrate top surface, comprising a first liquid 212 and emissive elements 214. The system comprises a reservoir 216, which contains a perturbation medium 218 and has an outlet port 220. The perturbation medium 218 may be the first liquid 212, a second liquid, or a gas. Optionally but not shown, a liquid perturbation medium may include emissive elements. One example of an emissive element is a light emitting diode (LED). Although not light emissive, other two-terminal surface mount elements include photodiodes, thermistors, pressure sensors, and piezoelectric devices. The emissive element may also be referred to as a surface mount emissive element.

In one aspect, emissive elements include a post orientation feature. Optionally, a plurality of posts may extend from a surface of the emissive element to enable the emissive element to be captured in a well in a post-up orientation. The emissive element is not limited to any particular number of posts, placement of posts, or any particular post shape. Additional details of this orientation feature can be found in the parent applications entitled DISPLAY WITH SURFACE MOUNT ELEMENTS, invented by Schuele et al, Ser. No. 15/410,001, filed on Jan. 19, 2017, and SYSTEM AND METHOD FOR THE FLUIDIC ASSEMBLY OF EMISSIVE DISPLAYS, invented by Sasaki et al., Ser. No. 15/412,731, filed on Jan. 23, 2017, which are incorporated herein by reference.

A distribution module 222 has an input connected to the reservoir outlet port 220 and an array of micropores 226 ejecting the perturbation medium 218 into the liquid suspension 210. As a result of the ejection of the perturbation medium 218, a laminar flow, as represented by reference designator 228, is created in the liquid suspension 210 along the top surface 206 of the emissive substrate 204 for the purpose of capturing the emissive elements 214 in the wells. More specifically, the laminar flow is parallel to the top surface 206 of the substrate in the region above the wells 208, especially above the wells at the level of the substrate top surface. The laminar flow may also be described as a flow driven by a pressure field in the fluid whose upward vertical component at the trapping recesses (wells 208), at the height of the substrate top surface 206, is less than the self-pressure of the emissive element 214. In the case of a 40 µm diameter, 5 µm thick emissive element for example, the self-pressure might be ~0.3 Pascal, the pressure due to the force of gravity on the emissive element. This describes a regime that does not cause any detrapment, but may be too restrictive. In practice, normal manufacturing processes may have some tolerance in the instantaneous upward vertical component, as long as the average self-pressure at the well sites is greater than the average upward vertical component. Alternatively stated, "laminar flow" as defined herein is a flow sufficient to cause emissive element trapping at the well sites, and insufficient to cause detrapment of emissive elements already occupying wells.

Excess liquid suspension 210 is drained into sump 224. The liquid suspension 210 may be initially provided as a bath, continuously supplied via an auxiliary input interface (not shown), or supplied via the distribution module.

As shown in the example of FIG. 2A, the distribution module 222 may be an array of micro-tubes 230 with micropore 226 orifices, or as shown in the example of FIG. 2B, the distribution module may be a solid manifold 231 with an array of microholes (micropores 226). As shown in the example of FIG. 2A, the array of micropores 226 may be located a predetermined distance over a top surface 232 of the liquid suspension 210, or as shown in the example of FIG. 2B, the array of micropores may be submerged in the liquid suspension. The laminar flow 228 is responsive to a number of variables including the pitch (spacing) between micropores, micropore diameters, array (micro-tube or manifold) material, perturbation medium ejection rate, perturbation medium ejection pressure, first fluid viscosity, first fluid density, first fluid polarity, liquid perturbation medium viscosity, liquid perturbation medium density, liquid perturbation medium polarity, and combinations thereof.

In either the example of FIG. 2A or 2B, the perturbation medium may be ejected using a positive pressure. However, in the case of a liquid perturbation medium being ejected from an overlying array of micropores (FIG. 2A), the perturbation medium may alternatively be ejected using the force of gravity. Thus, the system 200 may comprise a pressure module 234 having a pressurized output 236. Here the pressure module is shown connected to an input 237 of the reservoir 216, however, in other aspects it may be interposed between the reservoir and distribution module, as would be well understood in the art. If the array of micropores 226 is submerged in the liquid suspension 210 (FIG. 2B), the application of a positive pressure may be alternated with a negative pressure into the liquid suspension, creating an oscillating laminar flow in the liquid suspension in response to a periodic cycle of perturbation medium ejection followed by liquid suspension intake. In another aspect, the pressure module 234 creates a pulsed pressurized output, so that the array of micropores 226 periodically ejects the perturbation medium 218, creating a pulsed ejection of perturbation medium in response to the pulsed pressure having a frequency in a range of 0.5 to 100 Hertz. As shown in examples below, the pressure module may be interposed between the distribution module and the reservoir in the form of pumps.

Using either type of distribution module 222, the array of micropores 226 can be used to regulate the thickness of the liquid suspension 210 overlying the emissive substrate top surface 206 in response to the ejection of a perturbation medium. If the perturbation medium 218 is a liquid, the rate at which it is ejected has a direct effect on liquid suspension 210 thickness. In the case of an array of micropores overlying the liquid suspension 210 ejecting a gas, the distance of the micropores from the liquid suspension top surface and the pressure of the ejection can be used decrease the liquid suspension thickness, as might be useful in removing the liquid suspension and drying the substrate 204.

Again using either type of distribution module 222, the liquid suspension 210 may have a first temperature, and a liquid perturbation medium 218 may have a second temperature, greater than the first temperature, for the purpose of decreasing (first liquid) viscosity and/or drying the first liquid 212.

Typically, a translation module 238 is used to move the array of micropores 226 in a predetermined pattern with respect to the emissive substrate top surface 206, synchronously with the ejection of the perturbation medium 218. As shown, the translation module is a moveable table underlying the chuck 202. Alternatively but not shown, the substrate may remain in a fixed position and the distribution module move.

Figure 3:
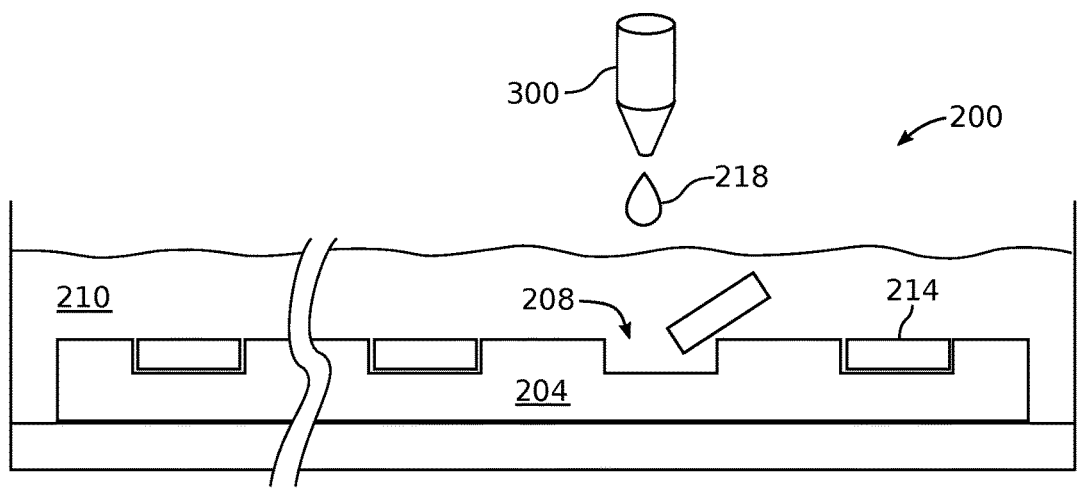
FIG. 3 is a partial cross-sectional view depicting a first variation of the microperturbation assembly system.

FIG. 3 is a partial cross-sectional view depicting a first variation of the microperturbation assembly system. In this aspect the system 200 further comprises an emissive element detrapping nozzle 300 that ejects perturbation medium 218 for the purpose of dislodging misaligned and damaged emissive elements 214 from the wells 208. Although the detrapping nozzle 300 is shown overlying the liquid suspension 210, in other aspects it may be submerged in the liquid suspension.

Figure 4A:
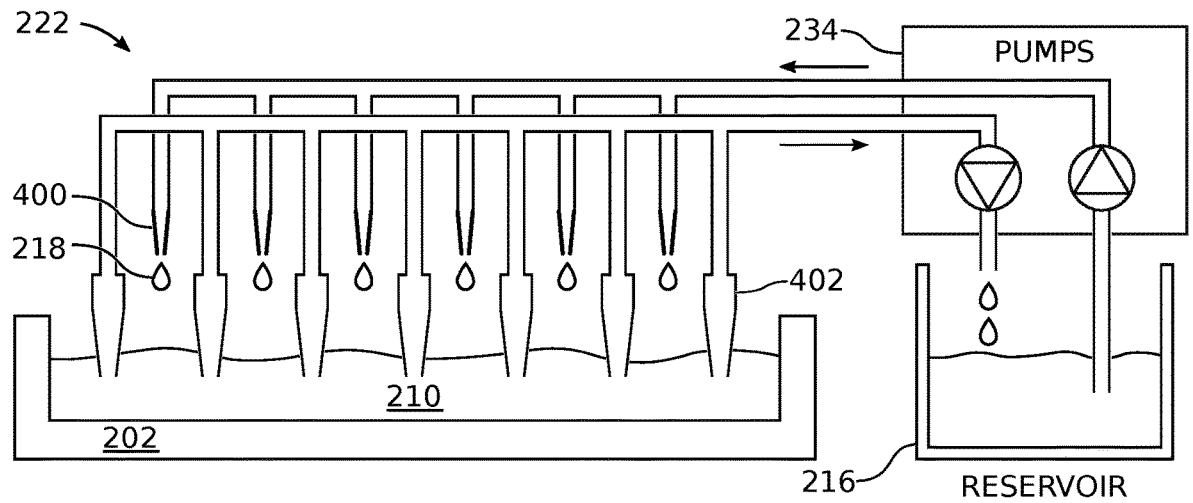
FIGS. 4A through 4C are partial cross-sectional views depicting a second variation of the microperturbation assembly system.
Figure 4B:
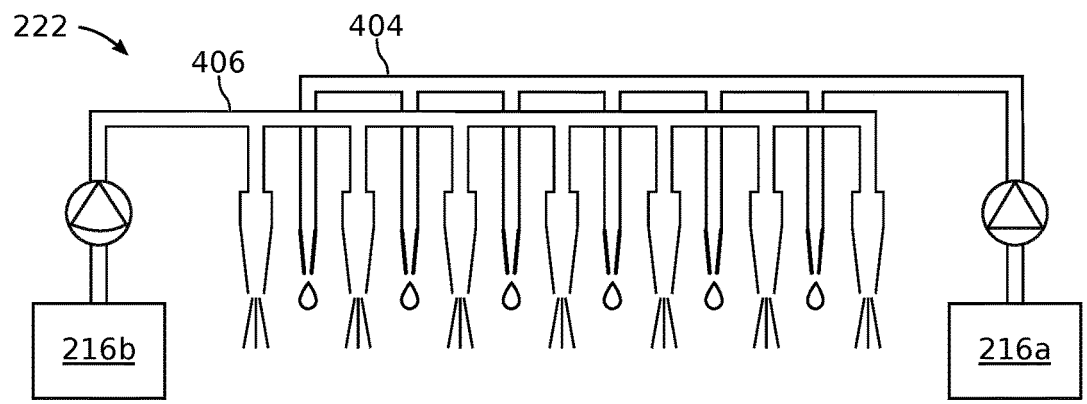
Figure 4C:
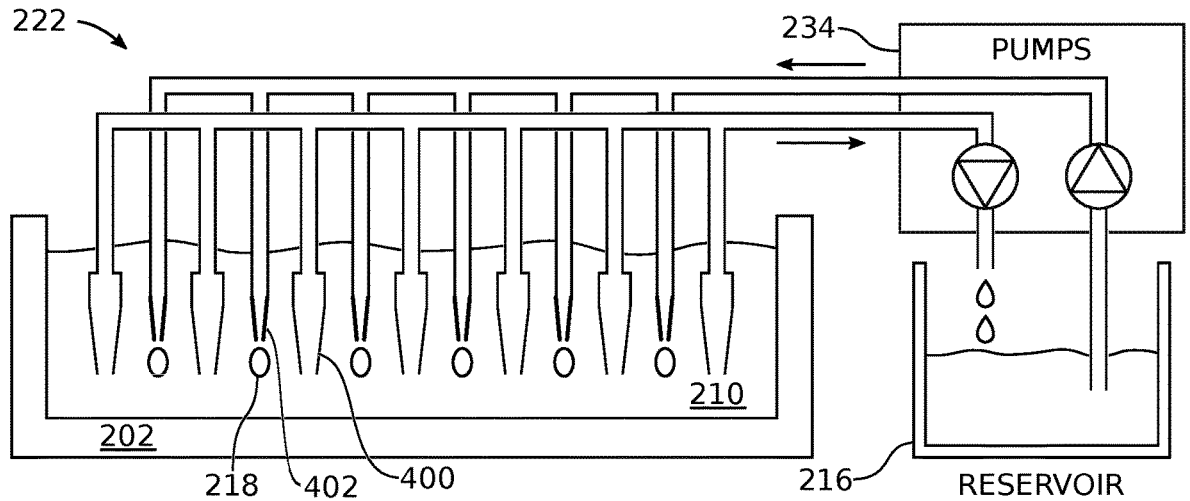

FIGS. 4A through 4C are partial cross-sectional views depicting a second variation of the microperturbation assembly system. In FIG. 4A the distribution module 222 comprises an interleaved array of micropores including a first group of micropores 400 ejecting the perturbation medium 218 and a second group of micropores 402, submerged in the liquid suspension 210, aspirating the liquid suspension. Here, the first group of micropores 400 is shown overlying the liquid suspension 210. In FIG. 4C the first group 400 is submerged in the liquid suspension.

In FIG. 4B the distribution module 222 comprises an interleaved array including a first group of micropores 404 ejecting a liquid perturbation medium and a second group of micropores 406 ejecting a gaseous perturbation medium. The first and second groups of micropores may be located overlying the liquid suspension or submerged in the liquid suspension.

Figure 5:
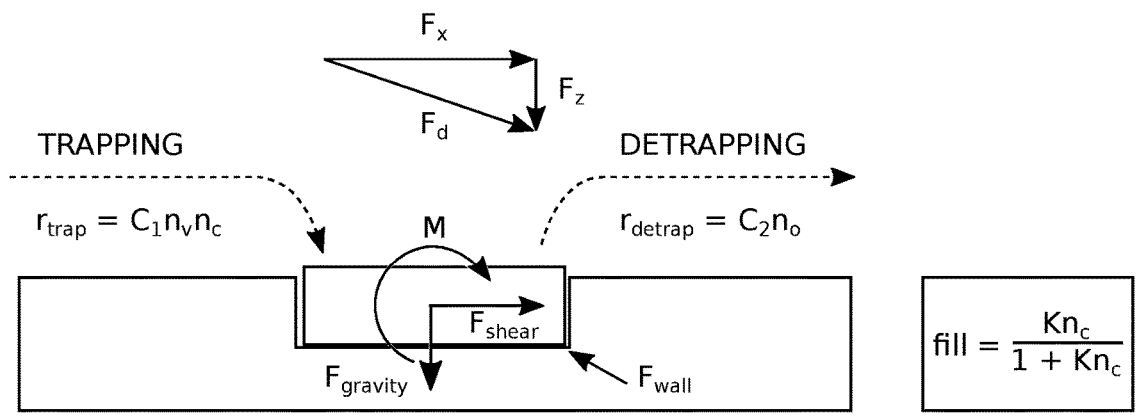
FIG. 5 is a schematic diagram depicting trap and detrapment rates shown along with other relevant forces.

FIG. 5 is a schematic diagram depicting trap and detrapment rates shown along with other relevant forces. Of particular note are the viscous forces F from an external driver, as well as moment (M) and $F_{wall}$, which are related to the component and recess geometry, and which may induce detrapment even in the case of purely transverse forcing ($F_2$=0). M is the cross-product of $F_{SHEAR}$ and the distance from the point of rotation to $F_{SHEAR}$, which may cause detrapment even without the existence of an upward force. If the component thickness is less than the recess depth and the recess sidewall is vertical or re-entrant (with outward sloping sidewalls), it can be seen that the component may be subjected to extremely high transverse forcing from the external driver without inducing detrapment. Additionally shown are the equilibrium rate considerations for trapping and detrapping, and the calculation of fill (fill=$Kn_C$/(1+$Kn_C$) at the equilibrium condition $r_{trap}$=$r_{detrap}$. The expectation value for the fill from assembly can thus be seen to be determined by the trapping constant $C_1$, detrapping constant $C_2$, and assembly time. The available number of components $n_C$, the number of vacancies $n_V$, and the number of occupied sites no are also of interest. The cost pressure of manufacturing encourages maximizing yield without unnecessarily increasing either the number of components for assembly or the assembly time. The trapping constant is most strongly determined by the trapping force used, and since the selectivity of one component per site often decreases with long-range trapping force, the majority of effective trapping schemes instead increase the trapping rate by ensuring the proximity of microcomponents to the trap sites as in Langmuir-Blodgett, centrifugal, or approaches for the assembly of non-buoyant components to an underlying substrate. The yield for a given trapping force approach may be optimized most effectively by tailoring the assembly approach to maximize component transit velocity while also minimizing the detrapment rate. Methods and structures that minimize detrapment are furthermore advantageous in that yield loss due to processing after assembly is also favorably affected.

The straightforward conclusion then is that the detrapment rate may be minimized by reducing the upward force experienced by trapped microcomponents. The low-detrapping forcing is primarily parallel to the assembly surface, with trapping force pulling the microcomponents against the surface and to the wells. In this idealized system, the detrapping forces approach zero. In practice, fluidic turbulence, microcomponent collision, eddy currents, vibrations, and the disposition force itself can induce varying intensities of upward force that cause detrapping.

If assembly time was not a concern, then extremely low, lateral forcing could be expected to achieve high yield fluidic assembly. Decreasing the assembly time necessarily correlates to increasing the disposition velocity as microcomponents must transit the substrate and reach the trapping sites. This increased disposition force creates the danger of detrapping, which necessitates the development of the techniques disclosed herein that focus on minimizing the detrapment of assembled microcomponents from recesses in a substrate.

Figure 6:
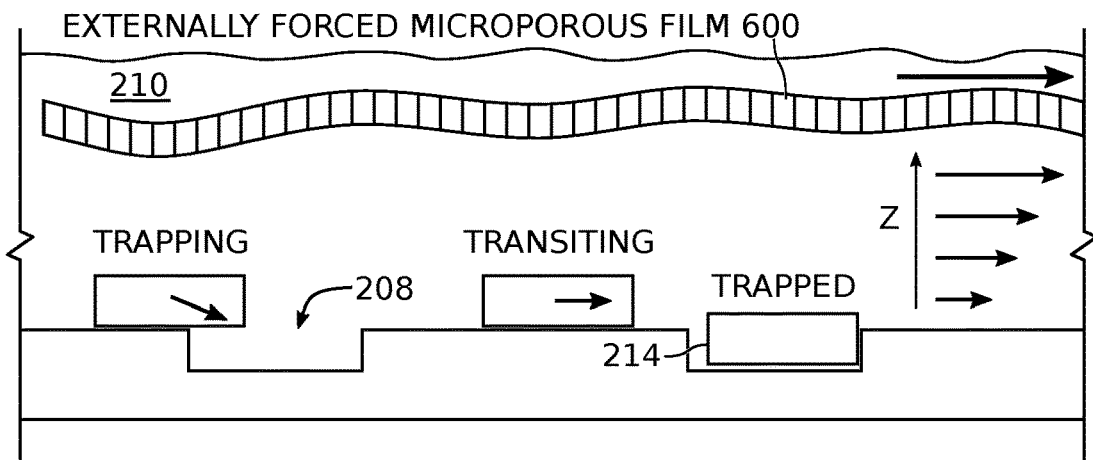
FIG. 6 is a partial cross-sectional view of a low turbulence lateral flow, analogous to a Couette flow, induced using a pliable microporous sheet translated parallel to the assembly substrate.

FIG. 6 is a partial cross-sectional view of a low turbulence lateral flow, analogous to a Couette flow, induced using a pliable microporous sheet translated parallel to the assembly substrate. The pliable sheet surface 600 moves proximal to the substrate surface and exerts a stronger force on unassembled components than on any emissive elements 214 trapped in the substrate recesses 208, as schematically shown. Micropores (not shown) in the sheet 600 enable fluid motion through the sheet, alleviating vertical pressure transients from the sheet motion that can lead to detrapment of assembled components. By using a pliable sheet 600 with a pore size significantly smaller than the microcomponent size, contact between the sheet and the microcomponents 214 causes neither damage nor significant adhesion to the microcomponents. In a test with several thousand components, a 25 micron (µm) thick polymeric sheet with a surface pore size of less than 1 µm was able to induce motion in 40 µm diameter microcomponents with 0% breakage and with less than 0.5% of the microcomponents resident (untrapped) on the sheet after assembly.

The test also demonstrated the effective selectivity of the Couette-analogous pliable assembly method in impelling unassembled microcomponents without detrapping assembled microcomponents, as only assembled components remained and did not detrap after additional passes of the microporous sheet. The method demonstrates not only assembly, but also effective and selective clean-off, which is necessary for efficient microcomponent usage and to prepare the surface for subsequent processing.

Figure 7A:
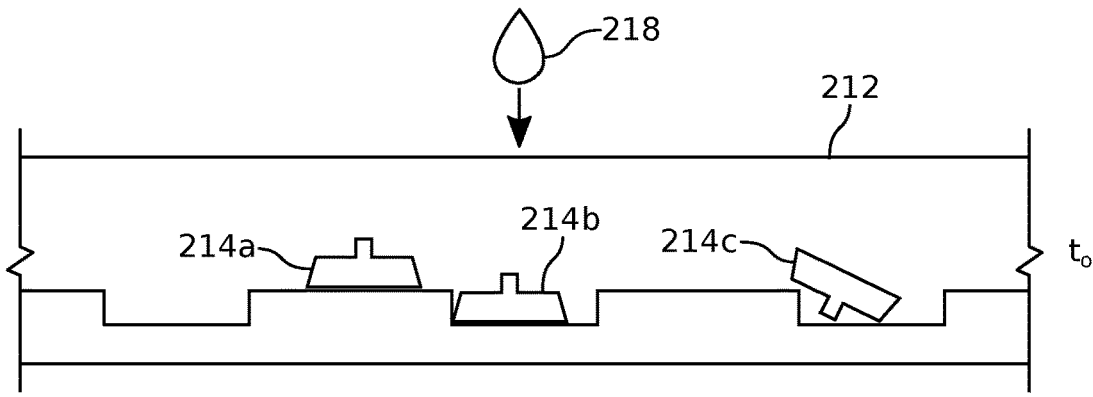
FIGS. 7A through 7C are schematics showing stages of droplet-impelled fluidic assembly with flow profiles.
Figure 7B:
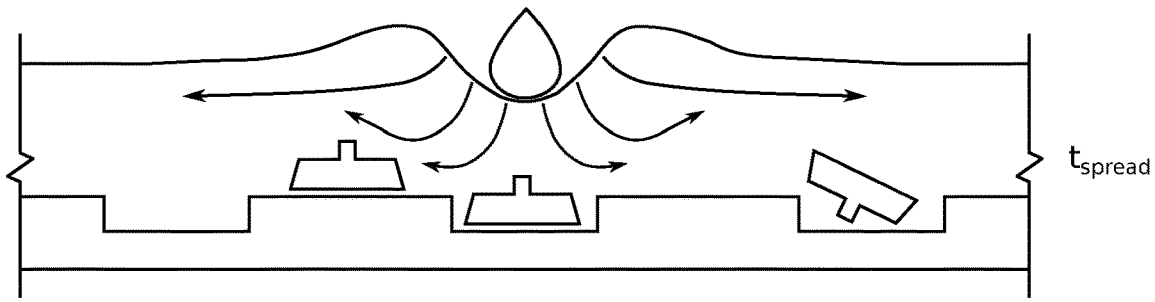
Figure 7C:
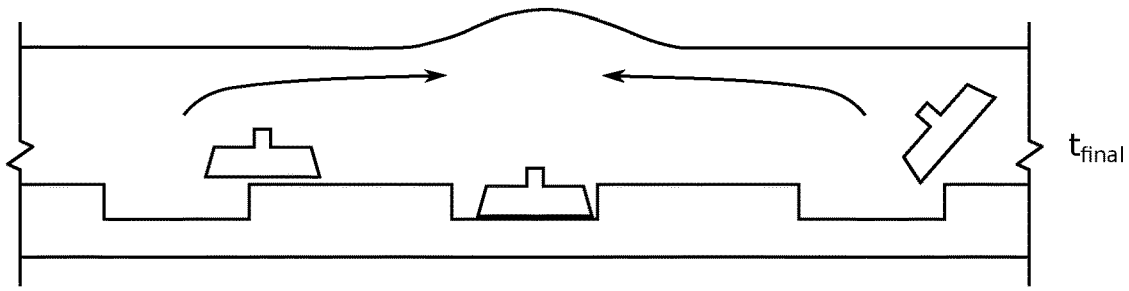

FIGS. 7A through 7C are schematics showing stages of droplet-impelled fluidic assembly with flow profiles. A low-profile unassembled component 214a experiences a small force with no restraint and moves a small amount. A low-profile component 214b in a recess (well) experiences a small force and cannot detrap. An assembled high-profile (misaligned) component 214c experiences a high force and escapes from the recess. This approach uses microperturbations to increase disposition speed while limiting microcomponent velocities within the critical velocity needed for trapping, and while still minimizing upward velocity. A thickness of assembly (first) fluid 212 over the recess-containing substrate mediates the force from a droplet 218 impinging on the fluid surface. The droplet induces a flow transient that briefly disrupts the microcomponents in an outward direction from droplet epicenter before the fluid re-equilibrates with a centering flow that is stronger near the fluid surface than the substrate surface. A weak restoring force does exist at the substrate surface that results in a steady state radial distribution of unassembled components with a radius of several millimeters, depending on drop size, drop viscosity, drop frequency, dropper height, and fluid thickness. Additionally, unlike Couette-analogous flow, the droplet-induced flow has been observed to cause the detrapment of microcomponents from recesses if certain parameters are exceeded.

While droplets can be pressure driven using pneumatic or technologies similar to inkjet printing, gravity-driven droplets often provide sufficient forcing, along with a simple and reliable self-organizing momentum. In particular, droplet size and height are controlled by dropper diameter and location above the substrate surface, while drop frequency is controlled by the pressure above the dropper. The full frequency range from zero to a continuous stream may be achieved with a variety of methods, from pumps, pneumatic pressure reservoirs, or a simple reservoir above the dropper. A sample assembly was fabricated with such a method using ~4 µm thick, 42 µm diameter emissive elements with asymmetric, auto-orienting geometries (posts) as described in parent application Ser. No. 15/410,001, filed Jan. 19, 2017. The substrate wells were 4.5 µm deep. The test resulted in 100% of the recesses being occupied by whole, undamaged microcomponents, 99.7% of which were correctly oriented, and no residual unassembled microcomponents remaining on the substrate surface. The assembly was performed with an isopropanol perturbation medium dripping from an 18 gauge (1.27 millimeter (mm) OD, 0.84 mm ID) stainless steel dropper from a height of 30 mm above the substrate surface. The liquid thickness was not controlled, but the natural meniscus formed a thickness of approximately 2 mm. The drop frequency was approximately 2 Hertz. The droplet-induced method demonstrated perfect assembly, zero breakage, near-perfect orientation, and perfect removal of unassembled components, using an extremely simple, low-cost infrastructure.

Figure 8A:
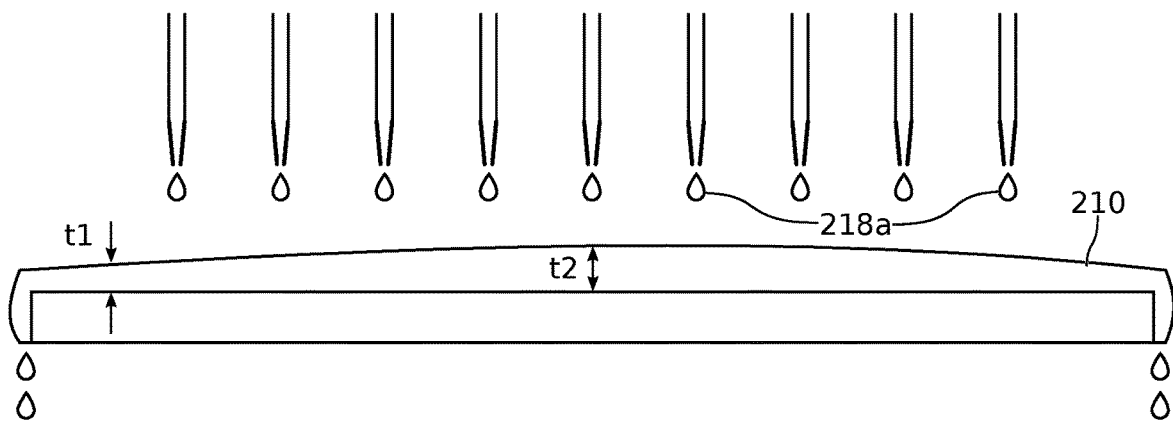
FIGS. 8A and 8B schematically depict the liquid management challenge of scaling the droplet-induced assembly method to large areas and high flow.
Figure 8B:
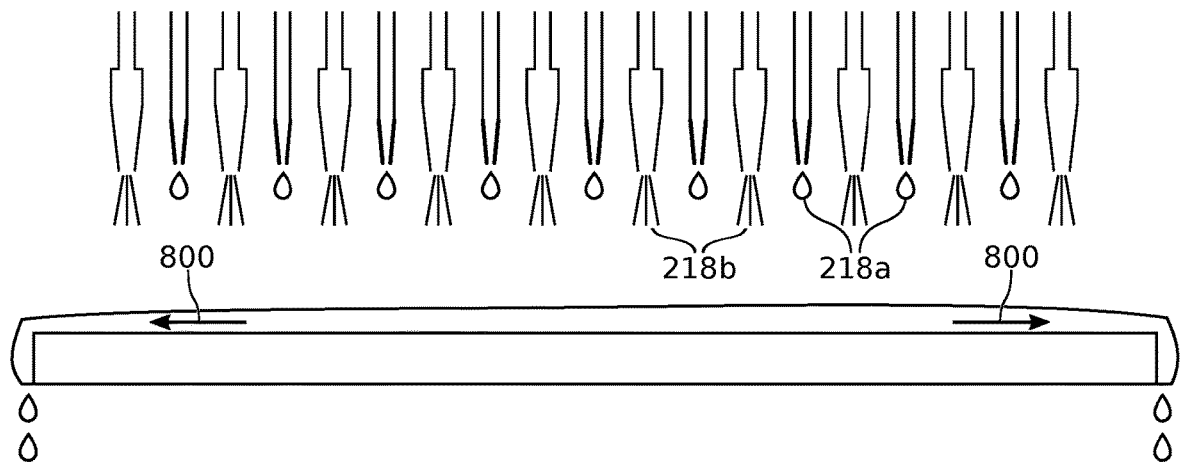

FIGS. 8A and 8B schematically depict the liquid management challenge of scaling the droplet-induced assembly method to large areas and high flow. As shown in FIG. 8A, if using just a liquid perturbation medium 218a, the liquid suspension 210 thickness may vary from substrate center to edge. As shown in FIG. 8B, by interleaving gas 218b nozzles with the liquid nozzles, pressure is exerted on the liquid suspension 210 surface, thinning the suspension at the cost of a higher outward fluid linear flow rate 800.

A primary challenge associated with the droplet-induced assembly method relates to liquid management. Scaling the method to fast assembly over large areas suggests the use of large arrays of droppers at a relatively tight pitch and high drop frequency. The volume flow rate of such a setup can easily exceed 30 Liters per minute per square meter of substrate. High assembly fluid flow rates, without mitigating liquid management, may create enough flow 800 at the substrate surface to negatively impact assembly and even induce detrapment. Additionally, the natural assembly fluid thickness at high flow rates is significantly higher and varies as shown in FIG. 8A. Greater suspension thickness reduces the droplet forcing and, thus, assembly uniformity.

Liquid management solutions, such as gas micro-tubes interleaved with the dropper array at a controlled height above the substrate, add system complexity to the assembly method, but can control the liquid thickness by exerting positive pressure to thin the liquid as shown in FIG. 8B, or by exerting negative pressure to pull assembly fluid off of the substrate as shown in FIG. 4A. This latter approach is particularly effective because it limits the net outward flow and represents a scalable microperturbation assembly method with excellent characteristics for assembly yield, orientation, selectivity, and detrapment.

Figure 9:
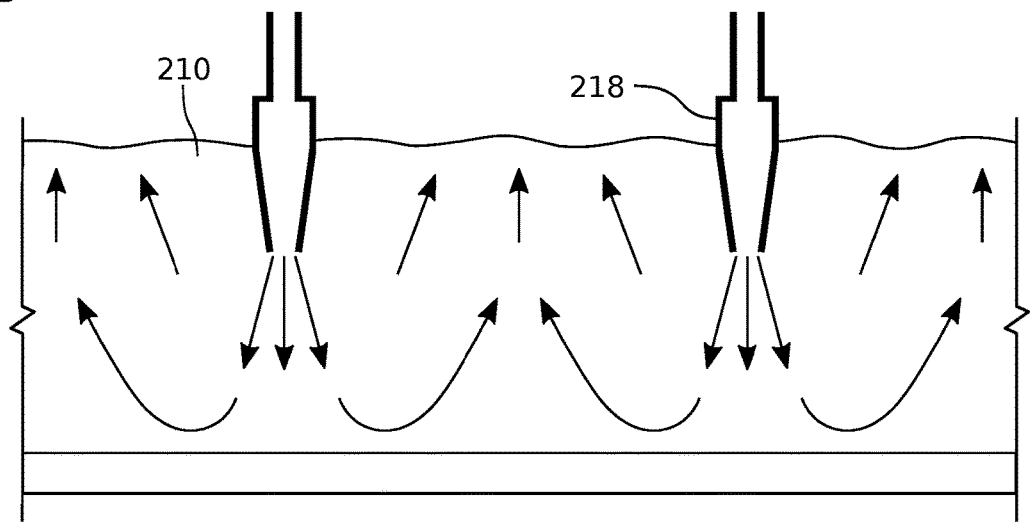
FIG. 9 depicts a detailed cross-sectional view of the direct injection of liquid perturbation medium into the liquid suspension, with the resulting net upward fluid flow.

FIG. 9 depicts a detailed cross-sectional view of the direct injection of liquid perturbation medium into the liquid suspension, with the resulting net upward fluid flow. The low-detrapment laminar flow microperturbations leading to assembly may be induced by perturbations caused by the fluid flow from the nozzle, by translation of the nozzle array, or both.

Rather than adding the complexity of a siphon array to the droplet-induced microperturbation assembly system as shown in FIG. 4A, an alternative variation obviates the challenges of net horizontal flow by replacing the microperturbations induced by the gravity-driven drops with a directly induced fluid velocity field created by submerging the assembly fluid injection nozzles. This results in a net upward flow of assembly fluid, away from the surface, where it can be simply collected and reintroduced without a using a precisely located siphon array. The forcing in this approach requires a more sophisticated control system impelling the fluid, but this affords a greater degree of control of fluid flow. Along with height, shape, motion, and pitch of the nozzle array, the fluid pulse/oscillation frequency, net flow, and amplitude of forcing may be optimized for the intrinsic and extrinsic properties of the substrate, assembly fluid, and microcomponents. The control afforded by the method allows scaling to high-speed assembly over large areas.

A variation on the above approach, which additionally simplifies liquid management, injects pressurized gas (e.g., air) into the liquid suspension. The dynamics of bubble-induced fluid flow at the substrate surface require control, but the microcomponent impulse magnitude can be so low that it does an excellent job of inducing high-frequency microperturbations in microcomponents on the surface. A test of this method with an assembly substrate having 6.5 μm deep, 46 μm wide recesses showed 100% local fill with zero breakage, 100% orientation, and a low population of residual unassembled microcomponents. Assembly was performed in ~10 mm deep isopropyl alcohol (IPA) with a 0.5 Bar air pressure through a 23 gauge blunt syringe tip (0.64 mm OD, 0.34 mm ID) suspended ~5 mm above the assembly substrate. This method is effective for use with a substrate having different sized well diameters, demonstrating excellent size-selectivity as only the larger diameter wells retain equivalently sized microcomponents, while the smaller diameter wells remain unoccupied.

Figure 10A:
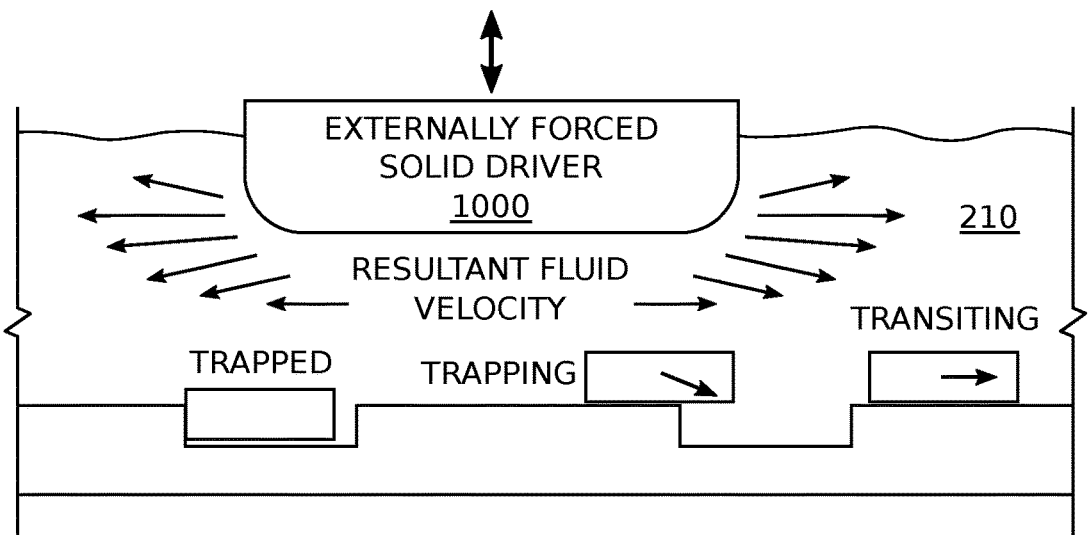
FIGS. 10A and 10B are, respectively, a partial cross-sectional view depicting a forced solid driver assembly method, and a graph of an associated asymmetric oscillation scheme to limit detrapping upward force as the driver moves away from the substrate surface.
Figure 10B:
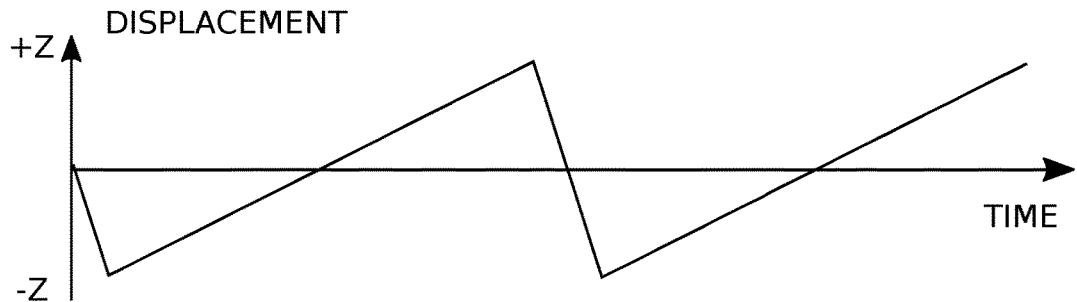

FIGS. 10A and 10B are, respectively, a partial cross-sectional view depicting a forced solid driver assembly method, and a graph of an associated asymmetric oscillation scheme to limit detrapping upward force as the driver moves away from the substrate surface. Rather than relying upon the chaotic oscillation in the fluid near the substrate surface from bubbles, low-detrapment assembly without a net-change in liquid suspension fluid can be enabled using a solid mechanical driver 1000 suspended near the substrate and partially submerged in the liquid suspension assembly fluid 210 to induce a more controlled oscillation in assembly fluid. Schematically depicted fluid velocity fields are shown in FIG. 10A. The solid body dimensions may vary from 1 mm to several centimeters (cm) in width, and may be driven in x, y, z, and rotational axes in a steady or oscillating speed scheme with frequencies in the range of 0 to 100 kilohertz (kHz). The high frequency range is for the purpose of reducing microcomponent friction by ultrasonic vibration. This high frequency range can be combined with larger amplitude solid body motion that ranges from 0 to 100 Hz to induce microperturbations at the substrate surface.

The oscillation pattern shown in FIG. 10B is designed to mimic the transient fluid velocity fields created by the droplet-induced assembly method and benefits from being asymmetric so as to limit turbulence and upward-force that may cause detrapment at higher frequencies and amplitudes. A 5 Hz oscillation was trialed in 2 mm of isopropanol assembly fluid with a 2 mm amplitude and successfully translated 42 μm diameter microcomponents with 0% detrapment of assembled components. The driver used was stainless steel and approximately 1 mm in width. A wider driver exerts a stronger force, and the design and drive scheme of this approach need to be tailored to the liquid suspension fluid, microcomponents, recess geometry, and substrate characteristics.

In the above experiment, the lowest extent of the solid body driver was less than 0.5 mm from the substrate surface in order to induce microcomponent motion. The risk of the solid body driver impacting and damaging the microcomponents or the substrate is a significant concern and may require a higher forcing using a wider driver body, a thin buffer layer to prevent direct contact to the substrate surface, or a very precise drive system and infrastructure to ensure that the oscillation does not cause damage. A precise drive system is necessary in any case in order to limit turbulence and upward force caused by the solid body driver motion.

Figure 11A:
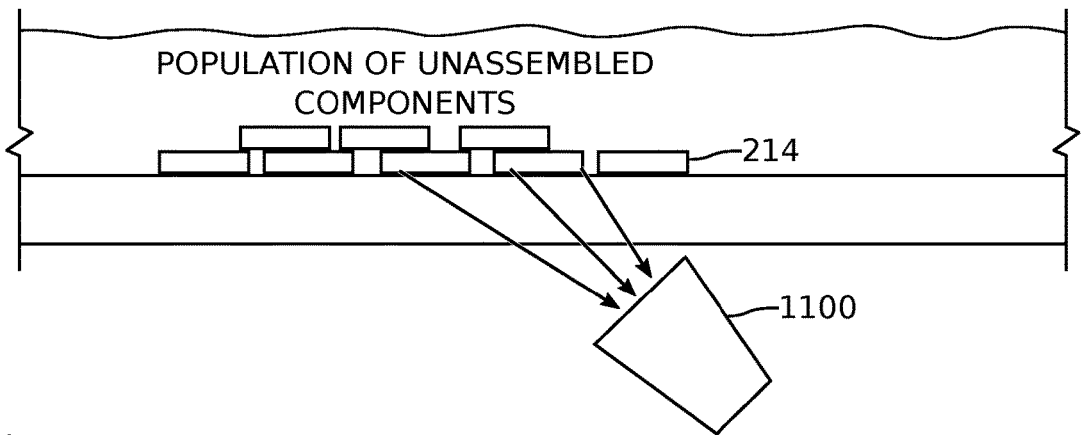
FIGS. 11A and 11B are force schematics associated with an attraction driver assembly method.
Figure 11B:
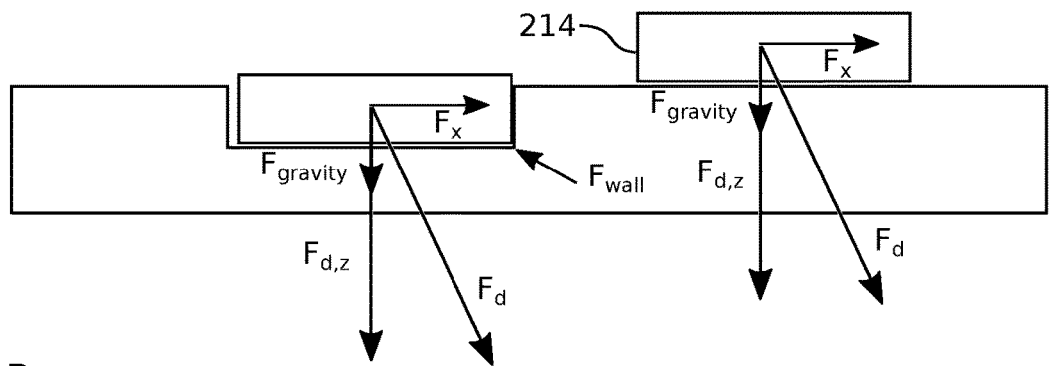

FIGS. 11A and 11B are force schematics associated with an attraction driver assembly method. For example, a magnetic force can be used to pull components towards and across the assembly substrate. FIG. 11A shows a translating driver 1100 exerting a pulling force on components 214 for assembly. FIG. 11B is free-body diagram demonstrating how attraction assembly can translate microcomponents and improve yield by increasing trapping force with a low risk of upward detrapping force. The attraction assembly method avoids turbulence concerns by directly and selectively forcing the microcomponents with a spatially heterogeneous attractive force that contributes to both trapping and disposition forces. The common characteristic of the above-described microperturbation approaches is that, although they limit detrapping force by controlling the perturbation amplitude, all of the forces are mediated by an assembly medium. However, the attraction assembly method is not mediated by the assembly fluid, but rather, it is a spatially heterogeneous attractive force located and translated below the substrate surface. Since the attractive force acts on the microcomponents directly, turbulence in the assembly fluid becomes vanishingly small. Microcomponents may be translated laterally, and the downward trapping force is enhanced beyond the small gravitational force experienced by the microcomponent, as shown in the diagram in FIG. 11B. In one aspect, the microcomponents are processed with a paramagnetic material, such as aluminum, that responds attractively to an external magnetic field. A strong magnetic field generator 1100 is then placed close to the bottom of the substrate and attracts the microcomponents. With spatial heterogeneity, the magnetic field generator can induce lateral motion in unassembled microcomponents while assembled microcomponents are retained in their recesses. Detrapping upward forces may be possible, based on the angle of attraction as well as the microcomponent and substrate sidewall topography, but can be easily mitigated.

Optionally, the attraction driver or array of drivers may be translated under the surface at significant speeds to induce the microperturbations, and then slowed to exert a more steady force to translate unassembled microcomponents away from the assembly area after 100% of recesses are occupied. As the downward trapping force is enhanced with this method, the threshold for lateral microcomponent momentum is accordingly raised, which results in a two-fold benefit: an increased trapping rate and a decreased detrapping rate.

Figure 12A:
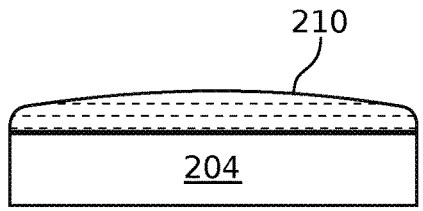
FIGS. 12A through 12D are partial cross-sectional views depicting the consequences of uncontrolled drying of the liquid suspension.
Figure 12B:
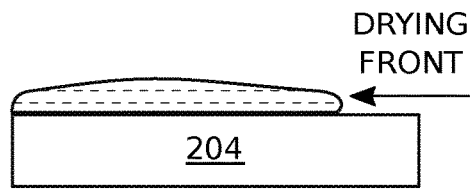
Figure 12C:
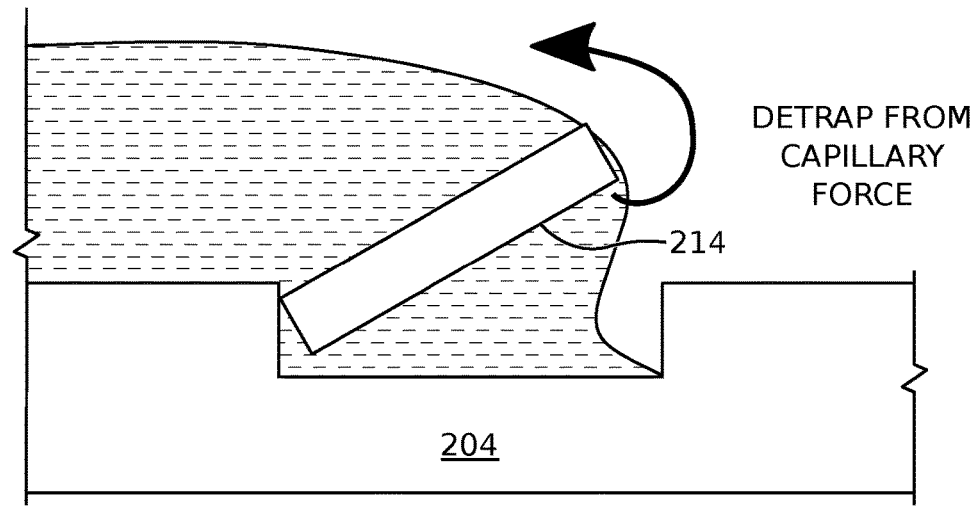
Figure 12D:
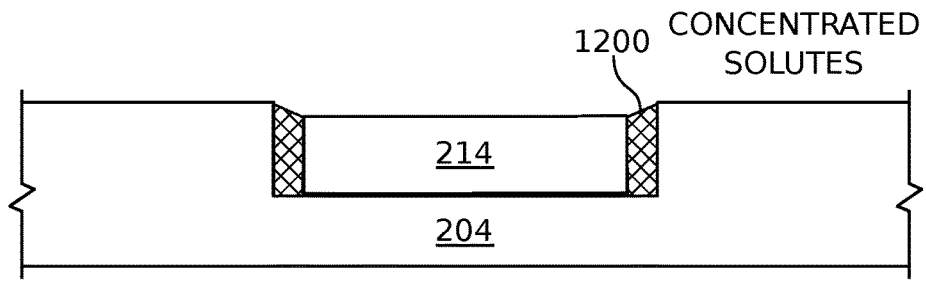

FIGS. 12A through 12D are partial cross-sectional views depicting the consequences of uncontrolled drying of the liquid suspension. The principles of limiting detrapment forces are relevant to one of the final assembly steps—the removal of liquid suspension from the substrate without detrapping the microcomponents. Liquid suspension, left to dry naturally, forms a contact angle (FIG. 11C) with the substrate based on their relative chemistries, which act to detrap emissive elements 214 from the wells. As the liquid suspension assembly fluid dries 210, any contaminating solutes 1200 naturally concentrate, potentially fouling microcomponents or interfering with their electrical contacts (FIG. 12D). Unfortunately, for weak trapping such as gravitational trapping in recesses, the capillary forces exerted by this drying front may far exceed the trapping force and induce detrapment of assembled microcomponents. Successful assembly of unfouled components, then, relies on preventing detrapment and mitigating solute concentration. In experiments, up to 78% of assembled microcomponents were removed from their recesses by a drying front. Those microcomponents that remained in wells were exposed to a higher concentration of any solutes, intentional or contaminant, in the assembly fluid. As these solutes may interfere with bonding and microcomponent function, it is desirable to limit their deposition into recesses with the microcomponents.

Figure 13A:
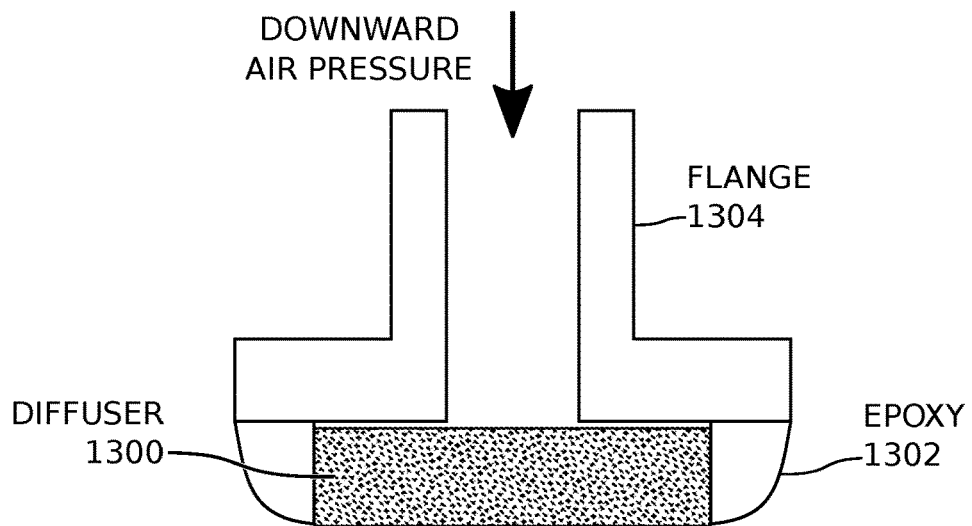
FIGS. 13A through 13C depict substrate drying tools.
Figure 13B:
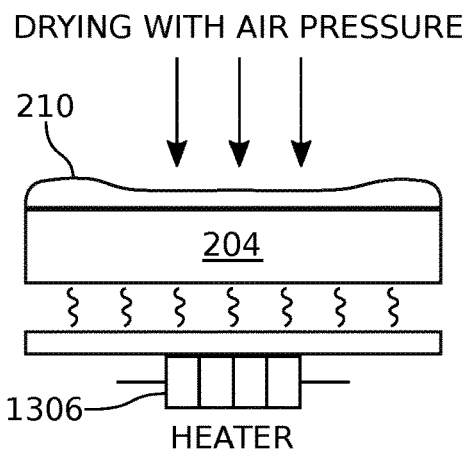
Figure 13C:
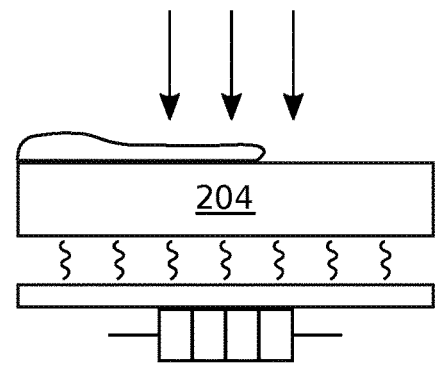

FIGS. 13A through 13C depict substrate drying tools. Capillary detrapment force can be limited during drying by mechanically reducing the thickness of the liquid suspension via an external downward force, as shown in FIG. 13A. To exert the downward force pressurized gas may be introduced to the substrate (not shown) through an assembly including a porous diffuser 1300 attached with epoxy 1302 to a flange 1304. Alternatively, surface tension can be reduced and volatility increased by heating the assembled substrate, using a drying air flow, or using a heater 1306 in combination with a drying air flow, as shown in FIGS. 13B and 13C. The inverse relationship between surface tension and temperature is well-documented. Both techniques have demonstrated less than a 1% loss (detrapment) of assembled components in testing, and are readily implemented in a manufacturing setting.

Figure 1A:
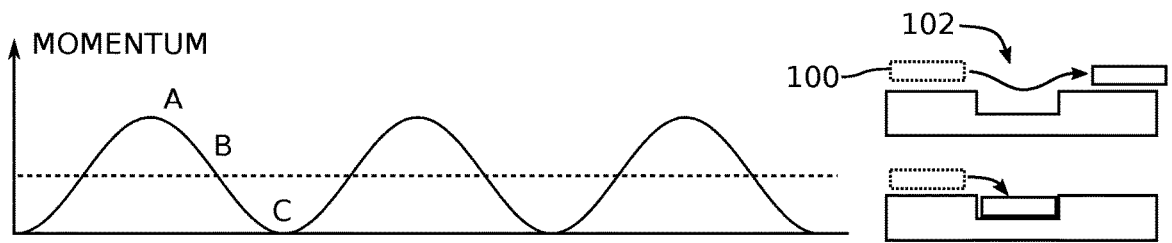
FIGS. 1A and 1B depict the relationship between the pulsed momentum of microcomponents and trapping (co-pending art).
Figure 1B:
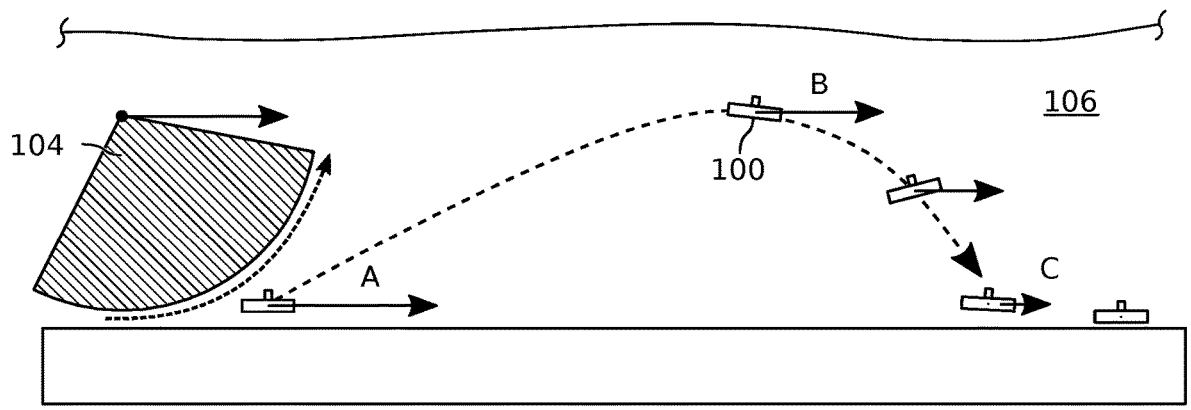
Figure 14:
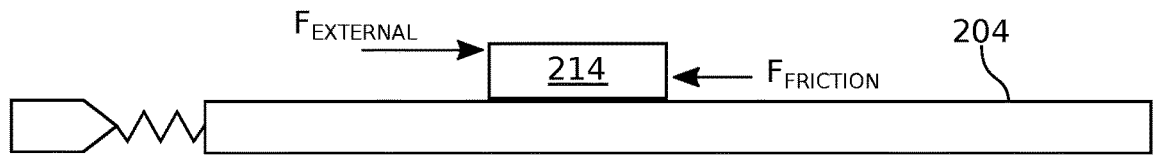
FIGS. 14 and 15 depict assembly methods using coupled acoustic oscillation.
Figure 15:
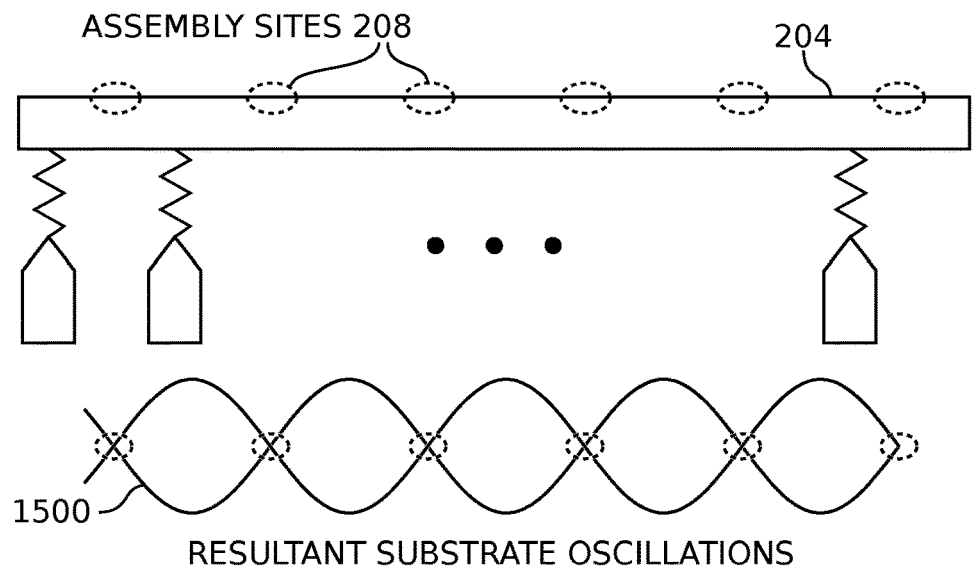

FIGS. 14 and 15 depict assembly methods using coupled acoustic oscillation. In FIG. 14 the assembly substrate 204 is oscillated at a frequency high enough to decouple the substrate 204 from the component 214, eliminating static friction and allowing for easier component motion. In performing any type of microperturbation assembly, a minimum amount of force is necessary to impel microcomponent movement. This force then continues to accelerate the microcomponent unless reduced. Microperturbation assembly can be seen as a method to translate microcomponents across an assembly substrate surface that has weak transverse trapping force, while optimizing the fraction of time the microcomponents are moving at a lower, trappable momentum (see FIG. 1). The lower limit of effective microperturbation amplitude is dictated in part by the static friction experienced by the microcomponent. To reduce static friction, an acoustic oscillation may be coupled into the assembly substrate. This general approach is widely used in industry and agriculture, but requires particular considerations for microcomponent assembly limited by weak orthogonal trapping forces. Primarily, the inertia of microcomponents is extremely small, so the frequency must be high to decouple microcomponents residing on the assembly substrate surface. Additionally, unpackaged microcomponents tend to be quite fragile and easily broken. The high frequency oscillation necessary to prevent static friction can potentially induce cavitation in the assembly fluid and may damage the microcomponents. Vertical amplitude must also be considered in order to prevent detrapment.

An assembly was tested with a 42 kHz oscillation coupled to a 25° tilted assembly substrate having wells with a 55 µm diameter and 5 µm depth. The test successfully demonstrated the steady motion of 50 µm emissive elements in a gravity-driven assembly in an IPA suspension. Without oscillation, at the same substrate tilt, the emissive elements did not move on the assembly surface.

While the acoustic waves of the above-described test were directed primarily perpendicular to the assembly surface, two potential refinements are presented. The first refinement, shown in FIG. 14, couples high frequency oscillation to the substrate in a manner that induces longitudinal acoustic waves. The strong advantage of this approach is its simplicity and low-risk of transverse displacement of the substrate at trap sites that may induce detrapment. The second refinement, shown in FIG. 15, induces a transverse oscillation into the assembly substrate such that a two-dimensional standing wave 1500 is generated with nodes co-located with trap sites (wells) 208 in the substrate. Depending on the desired trap site spacing and oscillation frequency, not all the nodes need necessarily be co-located with trap sites. However, all trap sites are located at the nodes to prevent an increased risk of detrapment due to the oscillations.

The method of FIG. 15 requires a more sophisticated control scheme, but has the advantage of reducing microcomponent residence time in the region between assembly sites. By ensuring maximum disruption of microcomponents away from trap sites and minimum disruption at trap sites, the overall assembly speed can be increased.

Taken as a whole, the systems of low-detrapment microperturbation presented above are suitable for weak-z trapping force assembly, and make for powerful assembly tools due to their relative simplicity, scalability, robustness, and speed.

Figure 16:
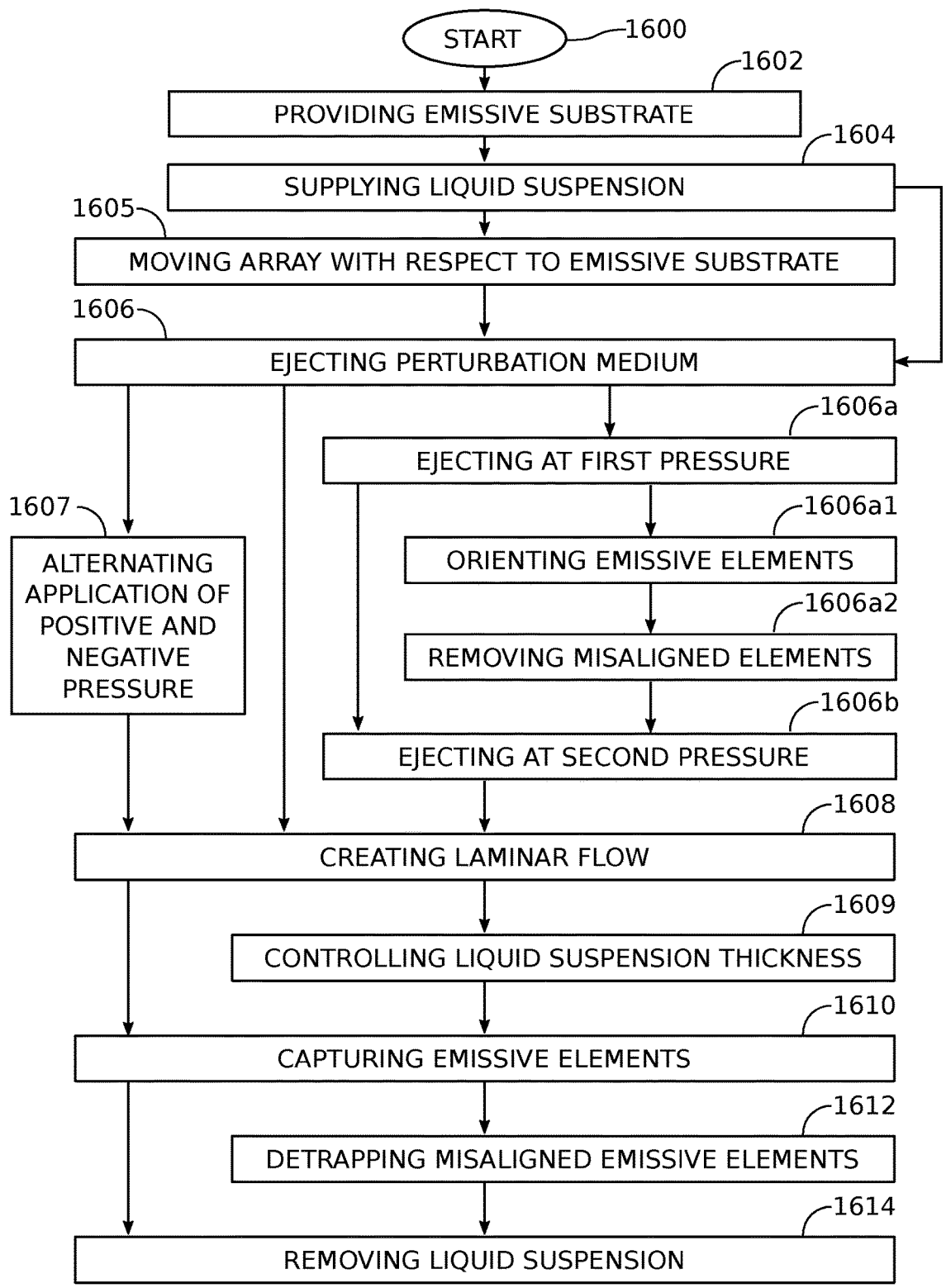
FIG. 16 is a flowchart illustrating a microperturbation fluidic assembly method for the fabrication of emissive panels.

FIG. 16 is a flowchart illustrating a microperturbation fluidic assembly method for the fabrication of emissive panels. Although the method is depicted as a sequence of numbered steps for clarity, the numbering does not necessarily dictate the order of the steps. It should be understood that some of these steps may be repeated, skipped, performed in parallel, or performed without the requirement of maintaining a strict order of sequence. Generally however, the method follows the numeric order of the depicted steps. The method starts at Step 1600.

Step 1602 provides an emissive substrate with a top surface patterned to form an array of wells. Step 1604 supplies a liquid suspension, comprising a first liquid and emissive elements, overlying the emissive substrate top surface. Using an array of micropores, Step 1606 ejects a perturbation medium into the liquid suspension. The perturbation medium optionally includes emissive elements. As noted above, the perturbation medium may be the first liquid, a second liquid, a gas or combinations thereof. Also as mentioned above, the array of micropores may be located a predetermined distance above the surface of the liquid suspension or submerged in the liquid suspension. Further, the perturbation may be ejected using the force of gravity or a positive pressure. In one aspect, Step 1604 supplies the liquid suspension with the first liquid having a first temperature, and Step 1606 ejects a selected perturbation medium having a second temperature, greater than the first temperature. In another aspect, Step 1606 periodically ejects the perturbation medium, creating a pulsed ejection having a frequency in a range of 0.5 to 100 Hertz.

In one variation, Step 1606 uses an interleaved array comprising a first group of micropores ejecting perturbation medium and a second group of micropores aspirating liquid suspension. Alternatively, the interleaved array comprises a first group of micropores ejecting a liquid perturbation medium and a second group of micropores ejecting a gaseous perturbation medium.

In Step 1608 a laminar flow is created in the liquid suspension along the top surface of the emissive substrate in response to the perturbation medium. In response to the laminar flow, Step 1610 captures the emissive elements in the wells. The laminar flow is responsive to a number of characteristics including: the pitch between micropores, micropore diameters, array (manifold or micro-tube) material, perturbation medium ejection rate, perturbation medium ejection pressure, first fluid viscosity, first fluid density, first fluid polarity, liquid perturbation medium viscosity, liquid perturbation medium density, liquid perturbation medium polarity, and combinations thereof. Liquid density affects buoyancy and therefore the microcomponent normal force. Polarity affects the surface stickiness of the emissive elements to the substrate.

In one variation Step 1606 includes substeps. Step 1606a initially ejects the perturbation medium at a first pressure to distribute the emissive elements across the top surface of the emissive substrate. Step 1606b subsequently ejects the perturbation medium at a second pressure, less than the first pressure. Then, the laminar flow of Step 1608 is created in response to the second pressure. In a related variation, Step 1604 supplies a liquid suspension comprising emissive elements with orientation posts. Then, initially ejecting the perturbation medium at the first pressure in Step 1606 includes the following substeps. Step 1606a1 orients the emissive elements in a post-up orientation is response to the orientation posts and the first pressure, and Step 1606a2 removes misaligned emissive elements.

In one aspect, simultaneous with creating the laminar flow in the liquid suspension, Step 1609 controls the thickness of the liquid suspension overlying the top surface of the emissive substrate in response to ejecting the selected perturbation medium. Note, this step may be optionally performed before and/or after the emissive elements are captured in the wells.

In one variation, Step 1606 ejects a selected liquid perturbation medium, and the method comprises an additional step. Using the array of micropores, Step 1607 alternates the application of a positive pressure with a negative pressure into the liquid suspension, creating a periodic cycle of selected liquid perturbation medium ejection followed by liquid suspension intake. As a result, Step 1608 creates an oscillating laminar flow in the liquid suspension. In another variation, synchronously with the ejection of the perturbation medium in Step 1606, Step 1605 moves the array of micropores in a predetermined pattern with respect to the emissive substrate top surface.

Subsequent to capturing the emissive elements in the wells (Step 1610), Step 1612 ejects perturbation medium from a detrapping nozzle to dislodge misaligned and damaged emissive elements from the wells. Step 1614 removes the liquid suspension from the emissive substrate by heating the emissive substrate, using the array of micropores to reduce the thickness of the liquid suspension overlying emissive substrate (e.g., using a gas medium), or a combination or both.

Microperturbation systems and methods have been presented for the assembly of emissive panels. Examples of particular materials, dimensions, and tools have been presented to illustrate the invention. However, the invention is not limited to merely these examples. Other variations and embodiments of the invention will occur to those skilled in the art.

We claim:

1. An emissive panel microperturbation fluidic assembly system, the system comprising:
   a substrate chuck for engaging an emissive substrate, the emissive substrate having a top surface patterned to form an array of wells;
   a liquid suspension, comprising a first liquid and emissive elements, overlying the emissive substrate top surface;
   a perturbation medium;
   a reservoir containing the perturbation medium, having an outlet port; and,
   a distribution module having an input connected to the reservoir outlet port and an array of micropores capable of ejecting the perturbation medium into the liquid suspension and creating a laminar flow in the liquid suspension along the top surface of the emissive substrate for the purpose of capturing the emissive elements in the wells; and, a translation module capable of moving the array of micropores in a predetermined pattern with respect to the emissive substrate top surface, synchronously with the ejection of the perturbation medium.

2. The system of claim 1 wherein the perturbation medium is selected from the group consisting of the first liquid, a second liquid, and a gas.

3. The system of claim 1 wherein the distribution module is selected from the group consisting of an array of micro-tubes with micropore orifices and a solid manifold with an array of microholes.

4. The system of claim 1 wherein the micropores eject a perturbation medium in response to a force selected from the group consisting of gravity and a positive pressure.

5. The system of claim 1 wherein the array of micropores regulates the thickness of the liquid suspension overlying the emissive substrate top surface in response to the ejection of a perturbation medium.

6. The system of claim 1 wherein the array of micropores is located in a position selected from the group consisting of a predetermined distance over a top surface of the liquid suspension and submerged in the liquid suspension.

7. The system of claim 1 wherein the liquid suspension first liquid has a first temperature; and, wherein perturbation medium is a liquid medium having a second temperature, greater than the first temperature, for the purpose of decreasing viscosity and drying the first liquid.

8. The system of claim 1 further comprising:

a pressure module having a pressurized output; and wherein the array of micropores is submerged in the liquid suspension, and is capable of alternating the application of a positive pressure with a negative pressure into the liquid suspension in response to the pressurized output and creating an oscillating laminar flow in the liquid suspension in response to a periodic cycle of perturbation medium ejection followed by liquid suspension intake.

9. The system of claim 1 further comprising:

a pressure module having a pulsed pressurized output; and wherein the array of micropores is capable of periodically ejecting the perturbation medium, in response to the pressurized output, and creating a pulsed ejection of perturbation medium in response to the pulsed pressure having a frequency in a range of 0.5 to 100 Hertz.

10. The system of claim 1 wherein the laminar flow is created in response to characteristics selected from the group consisting of pitch between micropores, micropore diameters, array material, perturbation medium ejection rate, perturbation medium ejection pressure, first fluid viscosity, first fluid density, liquid perturbation medium viscosity, liquid perturbation medium density, and combinations thereof.

11. The system of claim 1 wherein the perturbation medium additionally comprises emissive elements.

12. The system of claim 1 further comprising:

an emissive element detrapping nozzle capable of ejecting perturbation medium to dislodge misaligned and damaged emissive elements from the wells.

13. The system of claim 1 wherein the distribution module comprises an interleaved array of micropores including a first group of micropores capable of ejecting the perturbation medium and a second group of micropores, submerged in the liquid suspension, capable of aspirating the liquid suspension.

14. The system of claim 1 wherein the distribution module comprises an interleaved array including a first group of micropores capable of ejecting a liquid perturbation medium and a second group of micropores capable of ejecting a gaseous perturbation medium.

15. An emissive panel microperturbation fluidic assembly system, the system comprising:

a substrate chuck for engaging an emissive substrate, the emissive substrate having a top surface patterned to form an array of wells;

a liquid suspension, comprising a first liquid and emissive elements, overlying the emissive substrate top surface;

a perturbation medium including emissive elements;

a reservoir containing the perturbation medium, having an outlet port; and, a distribution module having an input connected to the reservoir outlet port and an array of micropores capable of ejecting the perturbation medium into the liquid suspension and creating a laminar flow in the liquid suspension along the top surface of the emissive substrate for the purpose of capturing the emissive elements in the wells.

16. The system of claim 15 wherein the perturbation medium is selected from the group consisting of the first liquid, a second liquid, and a gas.

17. The system of claim 15 wherein the distribution module is selected from the group consisting of an array of micro-tubes with micropore orifices and a solid manifold with an array of microholes.

18. The system of claim 15 wherein the micropores eject a perturbation medium in response to a force selected from the group consisting of gravity and a positive pressure.

19. The system of claim 15 wherein the distribution module comprises an interleaved array including a first group of micropores capable of ejecting a liquid perturbation medium and a second group of micropores capable of ejecting a gaseous perturbation medium.

20. The system of claim 15 wherein the array of micropores is located in a position selected from the group consisting of a predetermined distance over a top surface of the liquid suspension and submerged in the liquid suspension.

21. The system of claim 15 wherein the liquid suspension first liquid has a first temperature; and, wherein perturbation medium is a liquid medium having a second temperature, greater than the first temperature.

22. The system of claim 15 further comprising:

a pressure module having a pressurized output; and wherein the array of micropores is submerged in the liquid suspension, and is capable of alternating the application of a positive pressure with a negative pressure into the liquid suspension in response to the pressurized output and creating an oscillating laminar flow in the liquid suspension in response to a periodic cycle of perturbation medium ejection followed by liquid suspension intake.

23. The system of claim 15 further comprising:

a pressure module having a pulsed pressurized output; and wherein the array of micropores is capable of periodically ejecting the perturbation medium, in response to the pressurized output, and creating a pulsed ejection of perturbation medium in response to the pulsed pressure having a frequency in a range of 0.5 to 100 Hertz.

24. The system of claim 15 further comprising:

a translation module capable of moving the array of micropores in a predetermined pattern with respect to the emissive substrate top surface, synchronously with the ejection of the perturbation medium.

25. The system of claim 15 wherein the laminar flow is created in response to characteristics selected from the group consisting of pitch between micropores, micropore diameters, array material, perturbation medium ejection rate, perturbation medium ejection pressure, first fluid viscosity, first fluid density, liquid perturbation medium viscosity, liquid perturbation medium density, and combinations thereof.

26. The system of claim 15 further comprising:
an emissive element detrapping nozzle capable of ejecting perturbation medium to dislodge misaligned and damaged emissive elements from the wells.

27. The system of claim 15 wherein the distribution module comprises an interleaved array of micropores including a first group of micropores ejecting the perturbation medium and a second group of micropores, submerged in the liquid suspension, aspirating the liquid suspension.

28. An emissive panel microperturbation fluidic assembly system, the system comprising:
a substrate chuck for engaging an emissive substrate, the emissive substrate having a top surface patterned to form an array of wells;
a liquid suspension, comprising a first liquid having a first temperature and emissive elements, overlying the emissive substrate top surface;
a perturbation liquid medium having a second temperature different than the first temperature;
a reservoir containing the perturbation medium, having an outlet port; and,
a distribution module having an input connected to the reservoir outlet port and an array of micropores capable of ejecting the perturbation medium into the liquid suspension and creating a laminar flow in the liquid suspension along the top surface of the emissive substrate for the purpose of capturing the emissive elements in the wells.

29. The system of claim 28 wherein the array of micropores is located in a position selected from the group consisting of a predetermined distance over a top surface of the liquid suspension and submerged in the liquid suspension.

30. An emissive panel microperturbation fluidic assembly system, the system comprising:
a substrate chuck for engaging an emissive substrate, the emissive substrate having a top surface patterned to form an array of wells;
a liquid suspension, comprising a first liquid and emissive elements, overlying the emissive substrate top surface;
a perturbation medium;
a reservoir containing the perturbation medium, having an outlet port;
a distribution module having an input connected to the reservoir outlet port and an array of micropores capable of ejecting the perturbation medium into the liquid suspension and creating a laminar flow in the liquid suspension along the top surface of the emissive substrate for the purpose of capturing the emissive elements in the wells; and,
an emissive element detrapping nozzle capable of ejecting perturbation medium to dislodge misaligned and damaged emissive elements from the wells.

31. The system of claim 30 wherein the perturbation medium is selected from the group consisting of the first liquid, a second liquid, and a gas.

32. An emissive panel microperturbation fluidic assembly system, the system comprising:
a substrate chuck for engaging an emissive substrate, the emissive substrate having a top surface patterned to form an array of wells;
a liquid suspension, comprising a first liquid and emissive elements, overlying the emissive substrate top surface;
a perturbation medium;
a reservoir containing the perturbation medium, having an outlet port; and,
a distribution module having an input connected to the reservoir outlet port and an array of interleaved micropores including a first group of micropores capable of ejecting the perturbation medium into the liquid suspension and a second group of micropores, submerged in the liquid suspension, capable of aspirating the liquid suspension, creating a laminar flow in the liquid suspension along the top surface of the emissive substrate for the purpose of capturing the emissive elements in the wells.

33. The system of claim 32 wherein the perturbation medium includes emissive elements.

34. The system of claim 32 further comprising:
an emissive element detrapping nozzle capable of ejecting perturbation medium to dislodge misaligned and damaged emissive elements from the wells.

35. An emissive panel microperturbation fluidic assembly system, the system comprising:
a substrate chuck for engaging an emissive substrate, the emissive substrate having a top surface patterned to form an array of wells;
a liquid suspension, comprising a first liquid and emissive elements, overlying the emissive substrate top surface;
a perturbation medium;
a reservoir containing the perturbation medium, having an outlet port; and,
a distribution module having an input connected to the reservoir outlet port and an array of interleaved micropores including a first group of micropores capable of ejecting a liquid perturbation medium into the liquid suspension and a second group of micropores capable of ejecting a gaseous perturbation medium, creating a laminar flow in the liquid suspension along the top surface of the emissive substrate for the purpose of capturing the emissive elements in the wells.

* * * * *